(12) United States Patent
Kim et al.

(10) Patent No.: US 11,756,944 B2
(45) Date of Patent: Sep. 12, 2023

(54) SEMICONDUCTOR WAFER

(71) Applicant: SAMSUNG ELECTRONICS CO., LTD., Suwon-si (KR)

(72) Inventors: Chang-Bum Kim, Seoul (KR); Sung Hoon Kim, Seongnam-si (KR); Dae Seok Byeon, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 145 days.

(21) Appl. No.: 17/023,533

(22) Filed: Sep. 17, 2020

(65) Prior Publication Data

US 2021/0202456 A1 Jul. 1, 2021

(30) Foreign Application Priority Data

Dec. 30, 2019 (KR) .......................... 10-2019-0177456

(51) Int. Cl.
| | |
|---|---|
| *H01L 25/18* | (2023.01) |
| *H01L 25/065* | (2023.01) |
| *H01L 23/544* | (2006.01) |
| *H01L 23/00* | (2006.01) |
| *H01L 25/00* | (2006.01) |

(52) U.S. Cl.
CPC ............ *H01L 25/18* (2013.01); *H01L 23/544* (2013.01); *H01L 24/08* (2013.01); *H01L 24/80* (2013.01); *H01L 25/0657* (2013.01); *H01L 25/50* (2013.01); *H01L 2223/5446* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| | | | |
|---|---|---|---|
| 8,261,219 B2 | 9/2012 | Chen et al. | |
| 8,384,231 B2* | 2/2013 | Grivna | H01L 23/49575 257/E21.705 |
| 10,714,497 B1* | 7/2020 | Nishida | H01L 29/40117 |
| 2006/0290911 A1 | 12/2006 | Jung | |
| 2014/0217556 A1* | 8/2014 | Peh | H01S 5/4087 257/620 |
| 2018/0233410 A1* | 8/2018 | James | H01L 21/6836 |
| 2018/0323105 A1* | 11/2018 | DeMaioribus | H01L 21/78 |
| 2020/0105682 A1* | 4/2020 | Liu | H01L 24/16 |
| 2020/0212018 A1* | 7/2020 | Lai | H01L 23/3121 |

(Continued)

FOREIGN PATENT DOCUMENTS

| | | |
|---|---|---|
| CN | 102117800 A * | 7/2011 |
| JP | 2003-37038 A | 2/2003 |

(Continued)

*Primary Examiner* — Telly D Green
(74) *Attorney, Agent, or Firm* — Sughrue Mion, PLLC

(57) ABSTRACT

A semiconductor wafer includes unit regions that are repeatedly arranged, and each unit region of the unit regions includes: at least one first chip region; and at least one second chip region spaced apart from the at least one first chip region by a scribe line, wherein a first area size of each of the at least one first chip region is different from a second area size of each of the at least one second chip region from a planar viewpoint.

17 Claims, 30 Drawing Sheets

(56) References Cited

U.S. PATENT DOCUMENTS

2021/0175133 A1* 6/2021 Choi ................. H01L 22/34
2021/0242160 A1* 8/2021 Kang ................. H01L 23/5383

FOREIGN PATENT DOCUMENTS

| JP | 2015-233106 A | 12/2015 |
| KR | 10-2005-0052103 A | 6/2005 |
| KR | 10-0545213 B1 | 1/2006 |
| KR | 10-0780849 B1 | 11/2007 |

* cited by examiner

FIG. 19
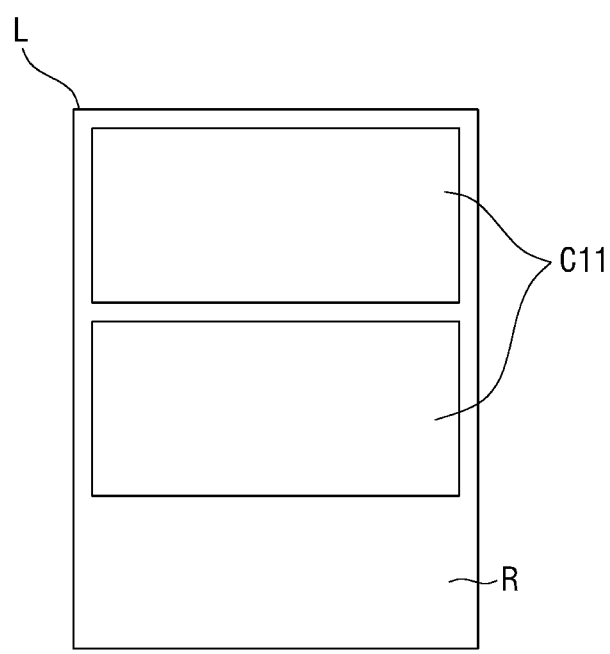
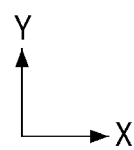

SEMICONDUCTOR WAFER

CROSS-REFERENCE TO THE RELATED APPLICATION

This application is based on and claims priority under 35 U.S.C. § 119 to Korean Patent Application No. 10-2019-0177456, filed on Dec. 30, 2019, in the Korean Intellectual Property Office, the disclosure of which is incorporated herein in its entirety by reference.

BACKGROUND

1. Technical Field

Embodiments of the present disclosure relate to a semiconductor wafer and a method for fabricating the same. More specifically, embodiments of the present disclosure relate to a semiconductor wafer including a plurality of chip regions spaced apart from each other by scribe lines and a method for fabricating the same.

2. Description of Related Art

A lithography technique may be used to generate a circuit pattern in a semiconductor device. The lithography technique is a process technique which transfers a mask pattern of a reticle (i.e., a photomask) onto a photosensitive substrate such as a wafer or a glass substrate coated with a photoresist or the like, using a lithography device (e.g., a stepper).

On the other hand, a unit of one lithography process using a mask pattern of the reticle may be referred to as a shot, and a lithography region of a wafer or a photosensitive substrate corresponding to one shot may be referred to as a shot region. When the lithography on one shot region is finished, the lithography on the next shot region may be performed, and the lithography technique on the entire wafer or photosensitive substrate may be executed with repetition of such a process.

SUMMARY

Aspects of embodiments of the present disclosure provide a semiconductor wafer in which product productivity is improved by minimizing the number of shots.

Aspects of embodiments of the present disclosure also provide a method for fabricating a semiconductor wafer in which product productivity is improved by minimizing the number of shots.

However, aspects of embodiments of the present disclosure are not restricted to the one set forth herein. The above and other aspects of embodiments of the present disclosure will become more apparent to one of ordinary skill in the art to which embodiments of the present disclosure pertain by referencing the detailed explanation of embodiments given below.

According to one or more embodiments, a semiconductor wafer is provided. The semiconductor wafer includes unit regions that are repeatedly arranged, and each unit region of the unit regions includes: at least one first chip region; and at least one second chip region spaced apart from the at least one first chip region by a scribe line, wherein a first area size of each of the at least one first chip region is different from a second area size of each of the at least one second chip region from a planar viewpoint.

According to one or more embodiments, a semiconductor wafer is provided. The semiconductor wafer includes: first chip regions arranged along a first direction; and second chip regions arranged along the first direction, wherein each of the first chip regions has a first length in the first direction, and has a second length in a second direction intersecting the first direction, and each of the second chip regions has a third length in the first direction that is equal to the first length, and has a fourth length in the second direction that is different from the second length.

According to one or more embodiments, a semiconductor wafer is provided. The semiconductor wafer includes: a first wafer including first unit regions that are repeated; and a second wafer including second unit regions that are repeated, the second wafer attached to the first wafer, wherein the first wafer includes a plurality of first chip regions, and each of the first unit regions includes a first chip region from among the plurality of first chip regions, and the second wafer includes a plurality of second chip regions, and each of the second unit regions includes a second chip region, from among the plurality of second chip regions, that corresponds to n first chip regions from among the plurality of first chip regions, where n is a natural number.

According to one or more embodiments, a method for fabricating a semiconductor wafer is provided. The method includes: forming a unit shot including at least one first chip region and at least one second chip region spaced apart from the at least one first chip region; providing the semiconductor wafer; and transferring the at least one first chip region and the at least one second chip region onto the semiconductor wafer, using the unit shot, wherein a first area size of each of the at least one first chip region is different from a second area size of each of the at least one second chip region.

BRIEF DESCRIPTION OF THE DRAWINGS

The above and other aspects and features of the present disclosure will become more apparent by describing in detail non-limiting example embodiments thereof with reference to the attached drawings, in which:

FIG. 19 is a first diagram for explaining the effects of the method for fabricating the semiconductor wafer according to some embodiments.

DETAILED EXPLANATION OF THE EMBODIMENTS

Hereinafter, a semiconductor wafer according to some embodiments will be explained with reference to FIGS. 1 to 15.

Figure 1:
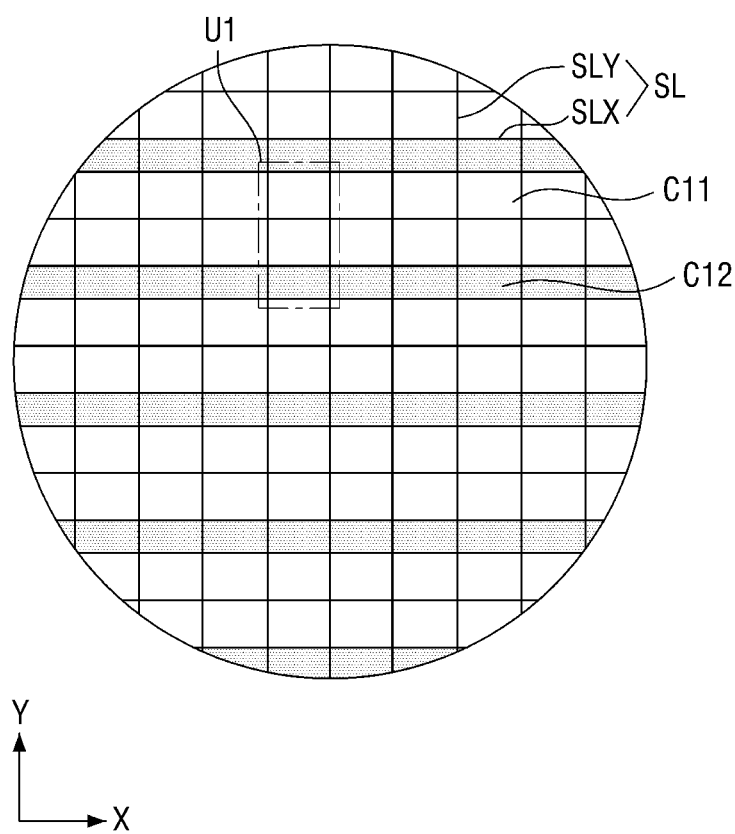
FIG. 1 is a plan view of a semiconductor wafer according to some embodiments.
Figure 2:
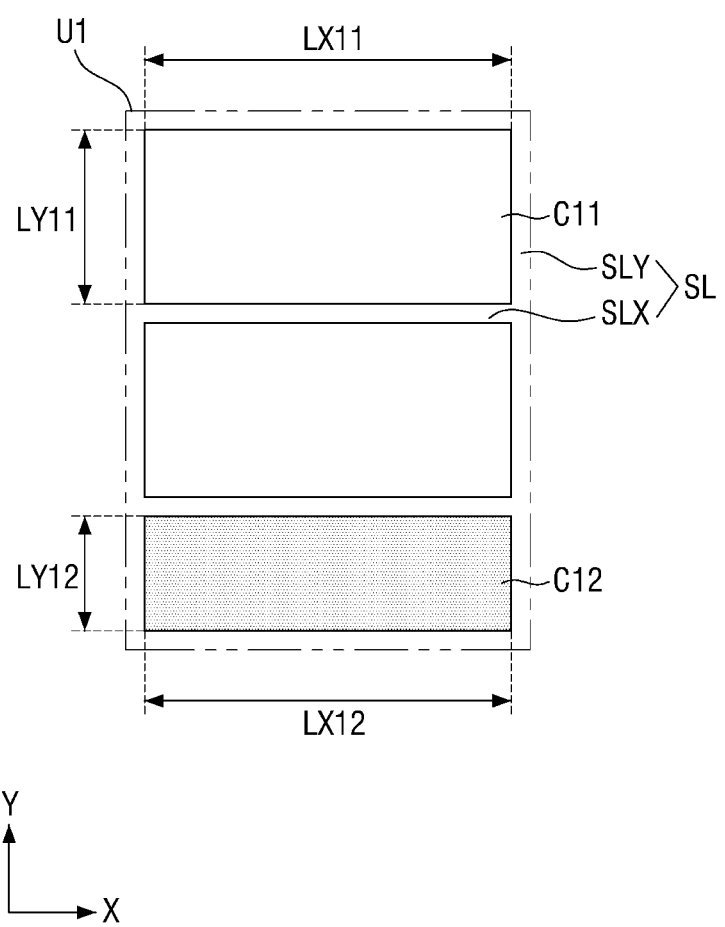
FIG. 2 is an enlarged view for explaining a first unit region of FIG. 1.
Figure 3A:
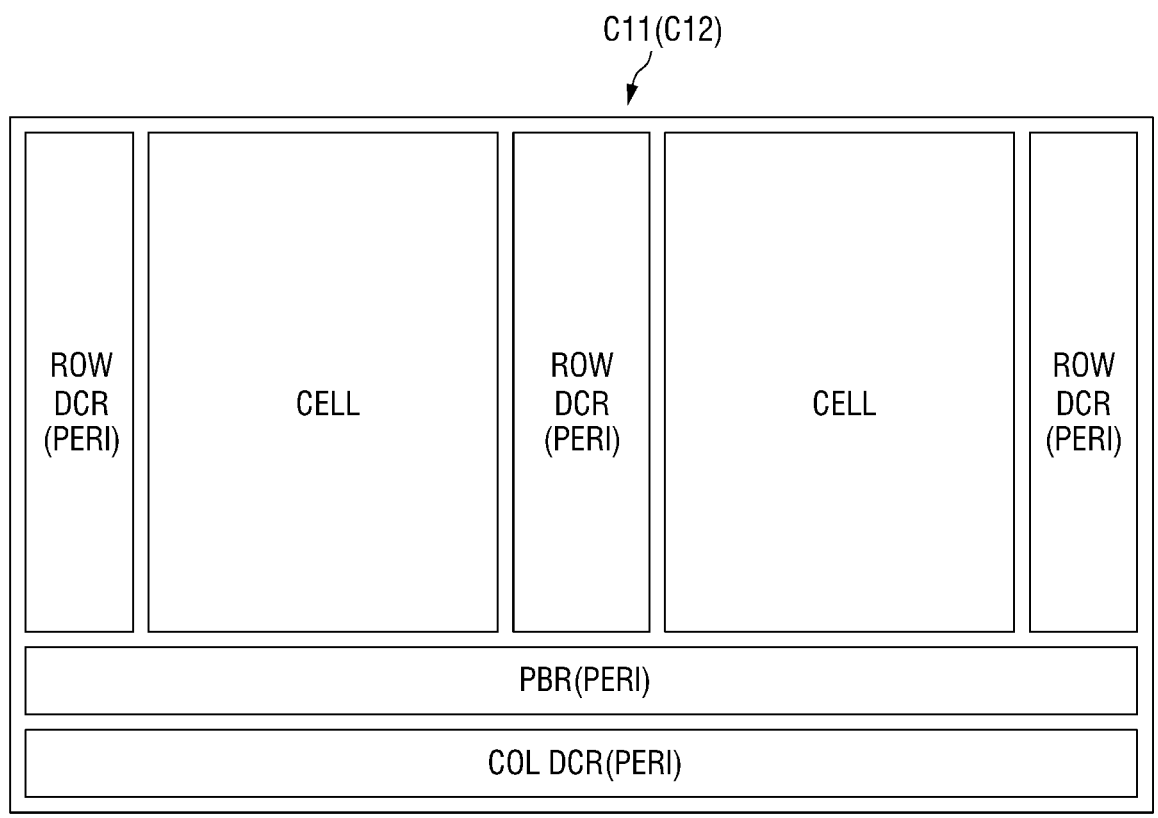
FIG. 3A is an example layout diagram for explaining a first chip region and a second chip region of FIG. 1.
Figure 3B:
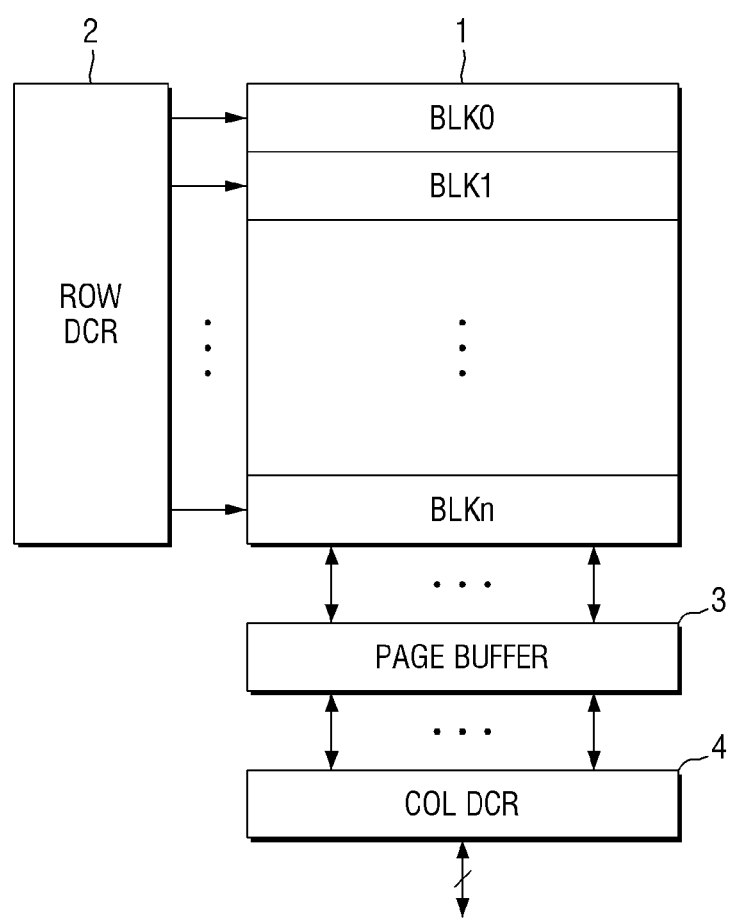
FIG. 3B is a block diagram for explaining the first chip region and the second chip region of FIG. 3A.
Figure 4:
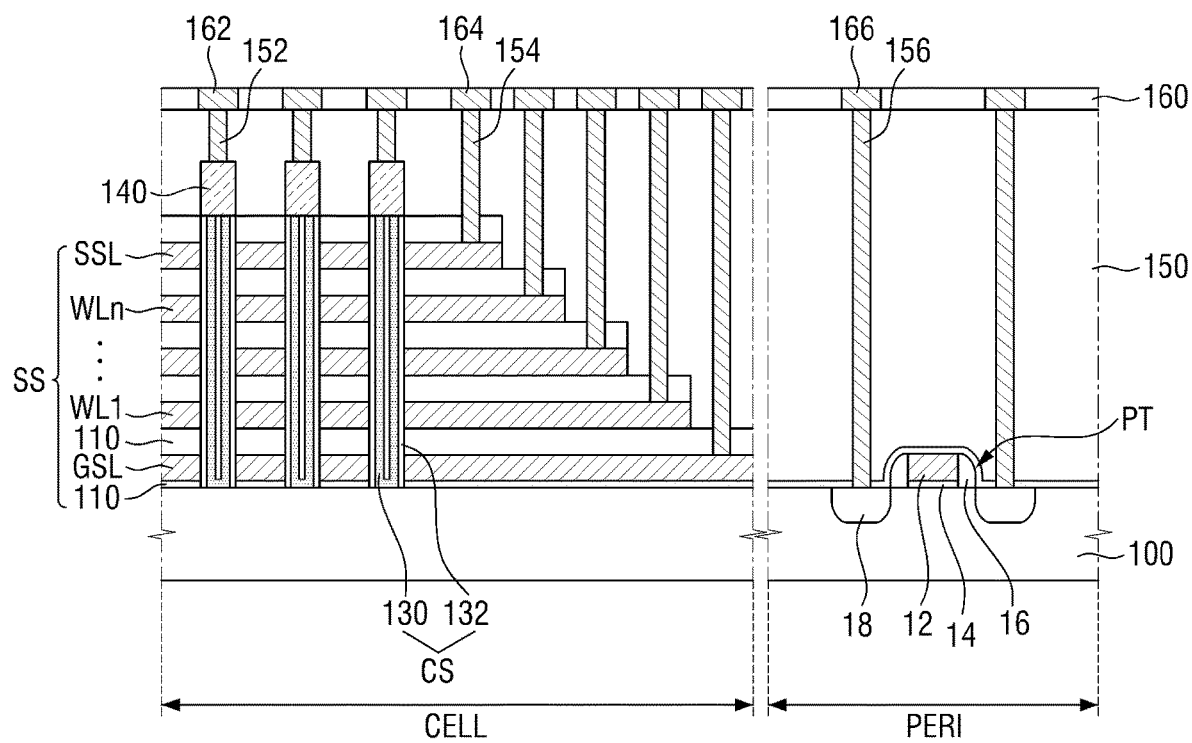
FIG. 4 is an example cross-sectional view for explaining the first chip region and the second chip region of FIG. 1.

FIG. 1 is a plan view of a semiconductor wafer according to some embodiments. FIG. 2 is an enlarged view for explaining a first unit region of FIG. 1. FIG. 3A is an example layout diagram for explaining a first chip region and a second chip region of FIG. 1. FIG. 3B is a block diagram for explaining the first chip region and the second chip region of FIG. 3A. FIG. 4 is an example cross-sectional view for explaining the first chip region and the second chip region of FIG. 1.

Referring to FIGS. 1 and 2, a semiconductor wafer according to some embodiments includes a plurality of a first unit region U1 that is repeated.

The semiconductor wafer may include, for example, a semiconductor substrate such as a silicon substrate, a germanium substrate or a silicon-germanium substrate. Alternatively, the semiconductor wafer may include a silicon-on-insulator (SOI) substrate, a germanium-on-insulator (GOI) substrate or the like.

Although it is not shown, the semiconductor wafer may, of course, include a flat zone or notch, which is a region formed to distinguish a crystal structure thereof.

Each first unit region U1 may include a first chip region C11 and a second chip region C12. The unit region represents the one shot region used in the lithography process. For example, the first chip region C11 and the second chip region C12 in the first unit region U1 may be processed in the same one shot in the lithography process. The first chip region C11 and the second chip region C12 may be spaced apart from each other by a scribe line SL. The scribe line SL is a region provided so that respective chip regions (e.g., the first chip region C11 and the second chip region C12) may be separated and cut in a dicing process on the semiconductor wafer.

The scribe line SL may also separate the plurality of the first unit region U1 from each other. For example, the scribe line SL may extend along the periphery of each first unit region U1. That is, the scribe line SL extends along the periphery of the first chip region C11 and the periphery of the second chip region C12, and may be provided such that the first chip region C11 and the second chip region C12 may be separated and cut.

The scribe line SL may be formed in a lattice shape. For example, the scribe line SL may include a horizontal line SLX extending along a first direction X, and a vertical line SLY extending along a second direction Y intersecting the first direction X.

The first chip region C11 may have a first length LX11 in the first direction X, and may have a second length LY11 in the second direction Y. The second chip region C12 may have a third length LX12 in the first direction X, and may have a fourth length LY12 in the second direction Y.

In some embodiments, a first area size of the first chip region C11 may be different from a second area size of the second chip region C12 from a planar viewpoint. For example, as shown in FIGS. 1 and 2, the first area size of the first chip region C11 may be greater than the second area size of the second chip region C12.

For example, the first length LX11 of the first chip region C11 may be equal to a third length LX12 of the second chip region C12, and the second length LY11 of the first chip region C11 may be greater than a fourth length LY12 of the second chip region C12. That is, each first unit region U1 may include the first chip region C11 and the second chip region C12 having area sizes that are different from each other. On the other hand, in the present specification, the term "the same" means not only the completely same thing but also a slight difference that may occur due to a margin in a process or the like. However, this is merely an example, and the first length LX11 of the first chip region C11 may be different from the third length LX12 of the second chip region C12.

In some embodiments, the first chip region C11 and the second chip region C12 may be arranged along the second direction Y in each first unit region U1. Since the first length LX11 of the first chip region C11 may be equal to the third length LX12 of the second chip region C12, the vertical line SLY of the scribe line SL may be formed in a straight line along the second direction Y.

In some embodiments, the plurality of the first unit region U1 may be arranged over the semiconductor wafer in a lattice shape. For example, the plurality of the first unit region U1 may be repeatedly arranged along the first direction X and the second direction Y. Therefore, a plurality of the first chip region C11 arranged in a line along the first direction X may be formed in the semiconductor wafer according to some embodiments. Further, a plurality of the second chip region C12 arranged in a line along the first direction X may be formed in the semiconductor wafer according to some embodiments.

Therefore, the vertical line SLY of the scribe line SL may separate the plurality of the first chip region C11 arranged along the first direction X from each other. Further, the vertical line SLY of the scribe line SL may separate the plurality of the second chip region C12 arranged along the first direction X from each other. In some embodiments, the vertical line SLY of the scribe line SL may be formed in a straight line along the second direction Y over the entire semiconductor wafer.

The horizontal line SLX of the scribe line SL may separate the first chip region C11 and the second chip region C12 arranged along the second direction Y from each other. In some embodiments, the horizontal line SLX of the scribe line SL may be formed in a straight line along the first direction X over the entire the semiconductor wafer.

In some embodiments, each first unit region U1 may include a plurality of the first chip region C11 or a plurality of the second chip region C12. For example, as shown in FIGS. 1 and 2, each first unit region U1 may include two of the first chip region C11. Although FIGS. 1 and 2 show that only one second chip region C12 is formed in each first unit region U1, this is merely an example.

Referring to FIGS. 1 to 3B, in the semiconductor wafer according to some embodiments, each of the first chip region C11 and the second chip region C12 may include a cell region CELL and a peripheral circuit region PERI.

In this specification, the first chip region C11 and the second chip region C12 are each explained as including a nonvolatile memory such as a flash memory. However, this is merely an example, and each of the first chip region C11 and the second chip region C12 may be a logic semiconductor chip or another form of semiconductor memory chip.

For example, each of the first chip region C11 and the second chip region C12 may be a logic semiconductor chip such as an application processor (AP) such as a central processing unit (CPU), a graphic processing unit (GPU), a field-programmable gate array (FPGA), a digital signal processor, an encryption processor, a microprocessor, a microcontroller, and an application-specific IC (ASIC).

Alternatively, for example, each of the first chip region C11 and the second chip region C12 may be a volatile memory such as a dynamic random access memory (DRAM) or a static random access memory (SRAM) or may be nonvolatile memory such as a phase-change random access memory (PRAM), a magnetoresistive random access memory (MRAM), a ferroelectric random access memory (FeRAM) or a resistive random access memory (RRAM).

The memory cell array 1 may be formed in the cell region CELL. The memory cell array 1 may include a plurality of memory cells, and a plurality of word lines and bit lines electrically connected to the memory cells. The memory cell array 1 may include a plurality of memory blocks BLK0 to BLKn that is a unit of data erase.

A peripheral circuit (not shown) which controls the memory cell array of the cell region CELL may be formed in the peripheral circuit region PERI. For example, the peripheral circuit region PERI may include row decoder regions ROW DCR, a page buffer region PBR, and a column decoder region COL DCR.

A row decoder 2 which selects the word lines of the memory cell array 1 may be placed in the row decoder region ROW DCR. The row decoder 2 may select one of the memory blocks BLK0 to BLKn of the memory cell array 1 in accordance with the address information, and may select one of the word lines of the selected memory block. The row decoder 2 may provide a word line voltage generated from a voltage generation circuit (not shown) to each of the selected word lines and the non-selected word lines in response to the control of a control circuit (not shown).

A page buffer 3 for reading information stored in the memory cells may be formed in the page buffer region PBR. The page buffer 3 may temporarily store data stored in the memory cells or sense data stored in the memory cells, depending on the operation mode. The page buffer 3 may operate as a write driver circuit in a program operation mode, and may operate as a sense amplifier circuit in a read operation mode.

A column decoder 4 connected to bit lines of the memory cell array 1 may be formed in the column decoder region COL DCR. The column decoder 4 may provide a data transfer path between the page buffer 3 and an external device (e.g., a memory controller).

Referring to FIGS. 1 to 4, in the semiconductor wafer according to some embodiments, each of the first chip region C11 or the second chip region C12 may include a substrate 100, a stacked structure SS, a channel structure CS, a first interlayer insulating film 150, a second interlayer insulating film 160, a bit line 162, gate electrodes and a peripheral circuit element PT.

The substrate 100 may include, for example, a semiconductor substrate such as a silicon substrate, a germanium substrate or a silicon-germanium substrate. Alternatively, the substrate 100 may include a silicon-on-insulator (SOI) substrate or a germanium-on-insulator (GOI) substrate.

The stacked structure SS, the channel structure CS, the bit line 162, and the gate electrodes may be formed in the cell region CELL to form the memory cell array 1 of FIGS. 3A and 3B.

The stacked structure SS may be formed on the substrate 100 in the cell region CELL. The stacked structure SS may include a plurality of gate electrodes and a plurality of insulating patterns 110 alternately stacked on the substrate 100.

In some embodiments, the gate electrodes may include a ground selection line GSL, a plurality of word lines WL1 to WLn, and a string selection line SSL, which are sequentially stacked on the substrate 100. The word lines WL1 to WLn may be used as gate electrodes of transistors which form the memory cell array 1 of FIG. 3B. In some embodiments, the ground selection line GSL may be placed at a lowermost part of the gate electrodes and the string selection line SSL may be placed at an uppermost part of the gate electrodes.

The gate electrodes may include a conductive material. For example, the gate electrodes may include, but are not limited to, metals such as tungsten (W), cobalt (Co) or nickel (Ni), or a semiconductor material such as silicon.

The insulating patterns 110 may include an insulating material. For example, the insulating patterns 110 may include, but are not limited to, silicon oxide.

The channel structure CS may penetrate the stacked structure SS. The channel structure CS may extend in a direction intersecting the respective gate electrodes. For example, the channel structure CS may have a pillar shape (e.g., a cylindrical shape) penetrating the stacked structure SS.

The channel structure CS may include a semiconductor pattern 130 and an information storage film 132. The semiconductor pattern 130 may penetrate the stacked structure SS and be connected to the substrate 100. Although the semiconductor pattern 130 is shown as having a cup shape, this is merely an example. For example, the semiconductor pattern 130 may have various shapes such as a cylindrical shape, a rectangular barrel shape, and a solid pillar shape.

The semiconductor pattern 130 may include, for example, but is not limited to, semiconductor materials such as single crystal silicon, polycrystalline silicon, organic semiconductor substance, and carbon nanostructure.

The information storage film 132 may be interposed between the semiconductor pattern 130 and each of the gate electrodes. For example, the information storage film 132 may extend along a side surface of the semiconductor pattern 130.

The information storage film 132 may include, for example, at least one of silicon oxide, silicon nitride, silicon oxynitride, and a high dielectric constant material having a higher dielectric constant than silicon oxide. Examples of the high dielectric constant material may include at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some embodiments, a channel pad 140 may be formed on the channel structure CS. The channel pad 140 may be formed to be connected to an upper part of the semiconductor pattern 130. The channel pad 140 may include, for example, but is not limited to, doped polysilicon.

The first interlayer insulating film 150 may be formed to cover the stacked structure SS, the channel structure CS, and a peripheral circuit element PT to be explained below. The first interlayer insulating film 150 may include, for example, but is not limited to, silicon oxide, silicon oxynitride, silicon nitride, and a low dielectric constant (low-k) material having a lower dielectric constant than silicon oxide.

The bit line 162 may be connected to the channel structure CS. For example, the bit line 162 may be connected to the channel structure CS through the bit line contact 152. The bit line contact 152 may penetrate the first interlayer insulating film 150 to connect the channel pad 140 and the bit line 162. Therefore, the semiconductor pattern 130 of the channel structure CS may be connected to the bit line 162.

In some embodiments, a cell contact 154 may be formed on the end portions of the gate electrodes. The cell contact 154 may penetrate, for example, the first interlayer insulating film 150 and be connected to each of the gate electrodes.

In some embodiments, a connection wiring 164 may be formed on the cell contact 154. The connection wiring 164 may be formed, for example, in the second interlayer insulating film 160 on the first interlayer insulating film 150. The connection wiring 164 may be connected to the cell contact 154. Therefore, the connection wiring 164 may be connected to each of the gate electrodes.

The peripheral circuit element PT may be formed in the peripheral circuit region PERI to form a peripheral circuit that controls the memory cell array 1 of FIGS. 3A and 3B.

In some embodiments, the peripheral circuit element PT may include a transistor. For example, the peripheral circuit element PT may include a peripheral circuit gate electrode 12, a peripheral circuit gate insulating film 14, a gate spacer 16, and a source/drain region 18.

The peripheral circuit element PT may be, for example, a high voltage transistor, but this is merely an example. For example, the peripheral circuit element PT may include not only various active elements such as a transistor, but also various passive elements such as a capacitor, a resistor, and an inductor.

In some embodiments, a first peripheral circuit contact 156 may be formed on the peripheral circuit element PT. The first peripheral circuit contact 156 may penetrate, for example, the first interlayer insulating film 150 and be connected to the peripheral circuit element PT.

In some embodiments, the first peripheral circuit wiring 166 may be formed on the first peripheral circuit contact 156. The first peripheral circuit wiring 166 may be formed, for example, in the second interlayer insulating film 160. The first peripheral circuit wiring 166 may be connected to the first peripheral circuit contact 156. Thus, the first peripheral circuit wiring 166 may be connected to the first peripheral circuit contact 156.

In some embodiments, a chip density of the first chip region C11 may be different from that of the second chip region C12. For example, when the first area size of the first chip region C11 is greater than the second area size of the second chip region C12, the chip density of the first chip region C11 may be greater than the chip density of the second chip region C12. For example, the chip density of the first chip region C11 may be 512 GB, and the chip density of the second chip region C12 may be 256 GB.

In some embodiments, the number of channel structures CS of the first chip region C11 may be greater than the number of channel structures CS of the second chip region C12.

Figure 5:
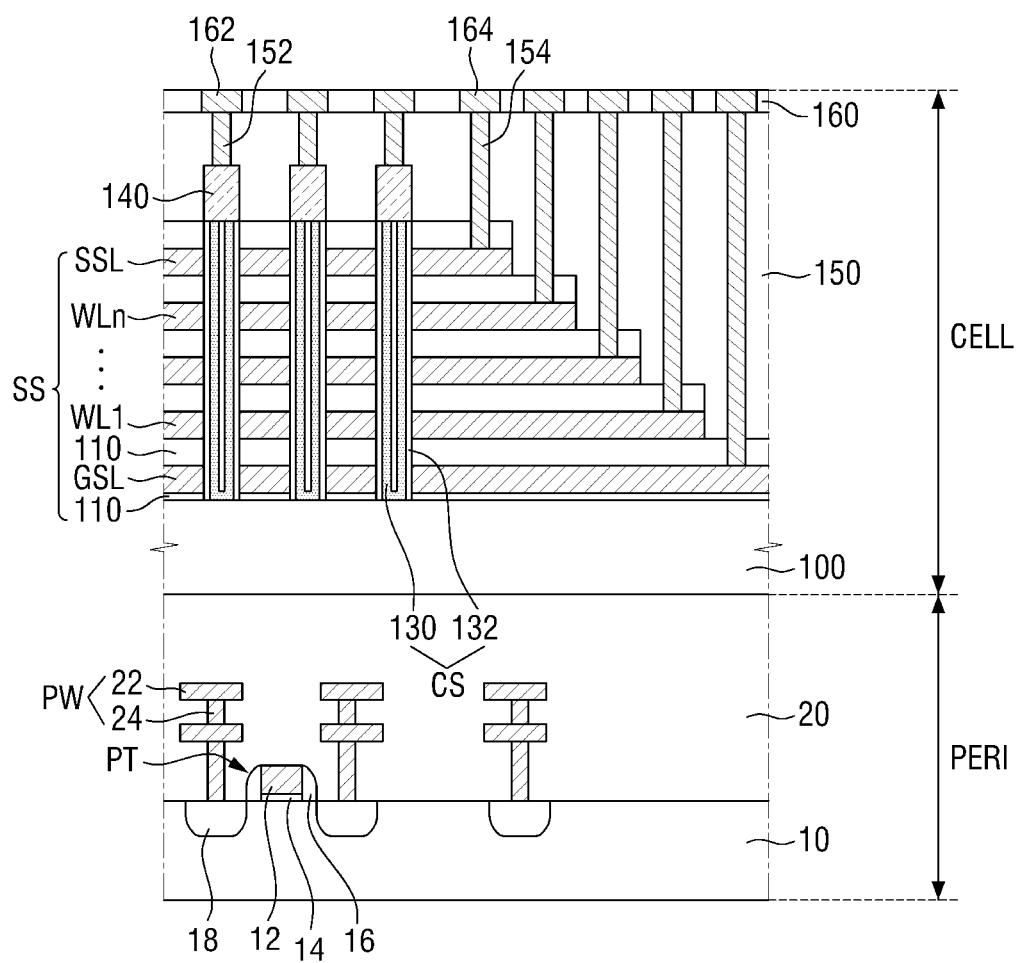
FIG. 5 is an example cross-sectional view for explaining the first chip region and the second chip region of the semiconductor wafer according to some embodiments.

FIG. 5 is an example cross-sectional view for explaining the first chip region and the second chip region of the semiconductor wafer according to some embodiments. For the sake of convenience, repeated parts of contents explained above using FIGS. 1 to 4 will be briefly explained or omitted.

Referring to FIG. 5, in the semiconductor wafer according to some embodiments, the cell region CELL of the first chip region C11 or the second chip region C12 may be formed on a peripheral circuit region PERI.

For example, the cell region CELL may be formed by being stacked on the peripheral circuit region PERI. That is, the cell region CELL and the peripheral circuit region PERI may overlap in a direction perpendicular to the upper surface of the substrate 100.

In some embodiments, the peripheral circuit element PT may be formed on a base substrate 10. The base substrate 10 may include, for example, a semiconductor substrate such as a silicon substrate, a germanium substrate or a silicon-germanium substrate. Alternatively, the base substrate 10 may include a silicon-on-insulator (SOI) substrate, a germanium-on-insulator (GOI) substrate or the like.

In some embodiments, a third interlayer insulating film 20 may be formed on the base substrate 10. The third interlayer insulating film 20 may be formed to cover the peripheral circuit element PT on the base substrate 10. Although the third interlayer insulating film 20 is shown as a single film, this is only for convenience of explanation, and the third interlayer insulating film 20 may, of course, be a multi-film in which a plurality of insulating films is stacked. The third interlayer insulating film 20 may include, for example, but is not limited to, silicon oxide.

In some embodiments, the wiring structure PW may be formed on the peripheral circuit element PT. The wiring structure PW may include a second peripheral circuit wiring 22 and a second peripheral circuit contact 24. The second peripheral circuit wiring 22 and the second peripheral circuit contact 24 may be formed, for example, in the third interlayer insulating film 20. The second peripheral circuit wiring 22 may be connected to the peripheral circuit element PT through the second peripheral circuit contact 24.

The second peripheral circuit wiring 22 may include, for example, but is not limited to, a metal (e.g., copper (Cu) or aluminum (Al)). Each of the second peripheral circuit contact 24 may include, for example, but is not limited to, silicon (e.g., polysilicon) or metal (e.g., tungsten (W) or copper (Cu)).

Figure 6:
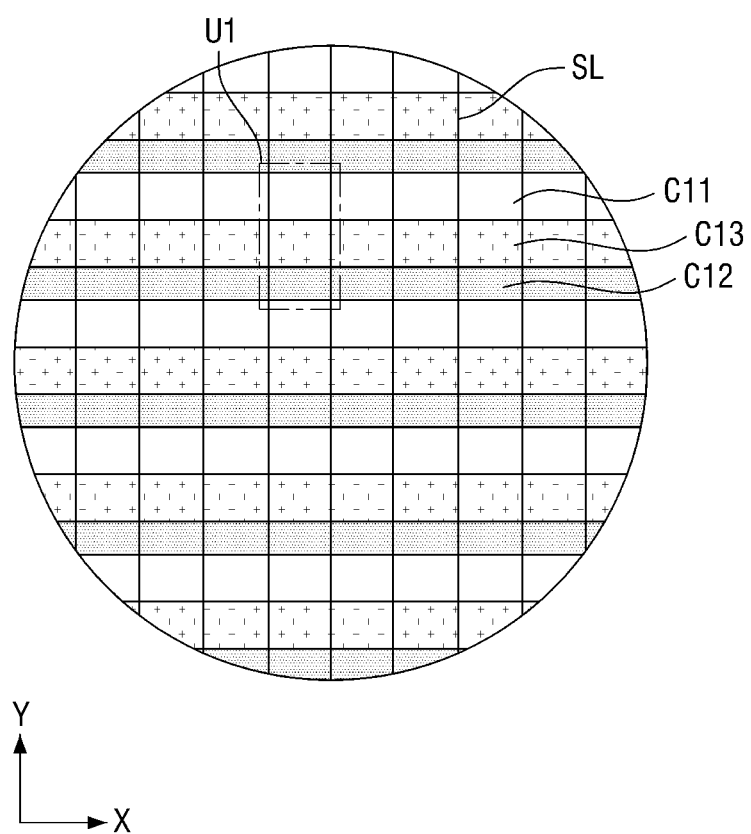
FIG. 6 is a plan view of the semiconductor wafer according to some embodiments.
Figure 7:
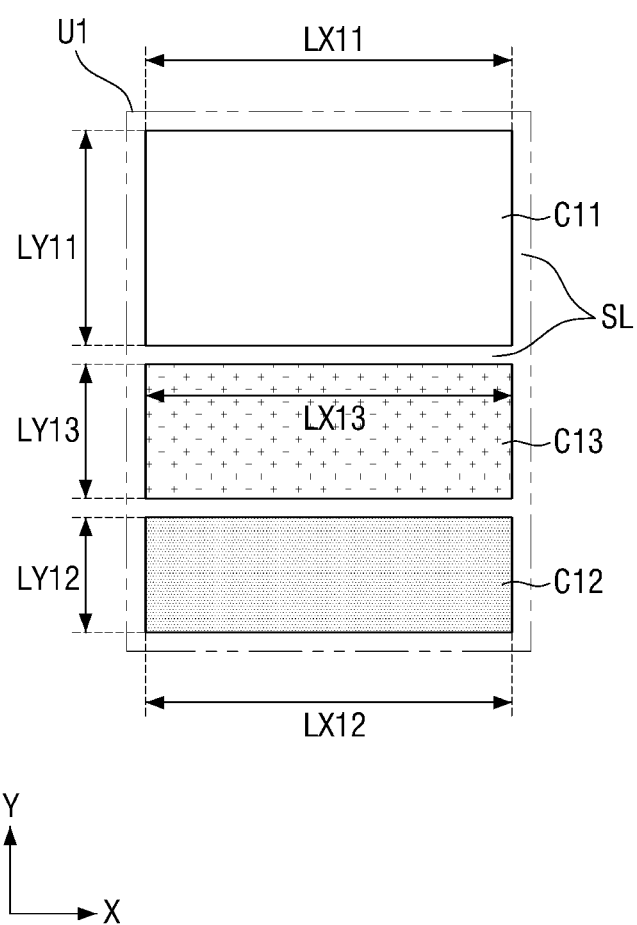
FIG. 7 is an enlarged view for explaining a first unit region of FIG. 6.

FIG. 6 is a plan view of the semiconductor wafer according to some embodiments. FIG. 7 is an enlarged view for explaining a first unit region of FIG. 6. For the sake of convenience of explanation, repeated parts of contents explained above using FIGS. 1 to 5 will be briefly explained or omitted.

Referring to FIGS. 6 and 7, in the semiconductor wafer according to some embodiments, each first unit region U1 may further include a third chip region C13.

The third chip region C13 may be spaced apart from the first chip region C11 and the second chip region C12 by the scribe line SL.

The third chip region C13 may have a fifth length LX13 in the first direction X and may have a sixth length LY13 in the second direction Y.

In some embodiments, a third area size of the third chip region C13 may be different from the first area size of the first chip region C11 and the second area size of the second chip region C12 from a planar viewpoint. For example, as shown, the third area size of the third chip region C13 may be smaller than the first area size of the first chip region C11, and may be greater than the second area size of the second chip region C12.

For example, a fifth length LX13 of the third chip region C13 may be equal to the first length LX11 of the first chip region C11 and the third length LX12 of the second chip region C12. Further, a sixth length LY13 of the third chip region C13 may be smaller than the second length LY11 of the first chip region C11, and may be greater than the fourth length LY11 of the second chip region C12. That is, each first unit region U1 may include a plurality of chip regions (the first to third chip regions C11, C12 and C13) having different area sizes from each other.

In some embodiments, each of the first to third chip regions C11, C12 and C13 may be arranged along the second direction Y within each first unit region U1. Although the third chip region C13 is shown as being interposed between the first chip region C11 and the second chip region C12 within each first unit region U1, this is merely an example, and the arrangement of the first to third chip regions C11, C12 and C13 may, of course, be various.

In some embodiments, the plurality of first unit regions U1 may be arranged over the semiconductor wafer in a lattice shape. Therefore, a plurality of third chip regions C13 arranged in a line along the first direction X may be formed in the semiconductor wafer according to some embodiments.

Figure 8:
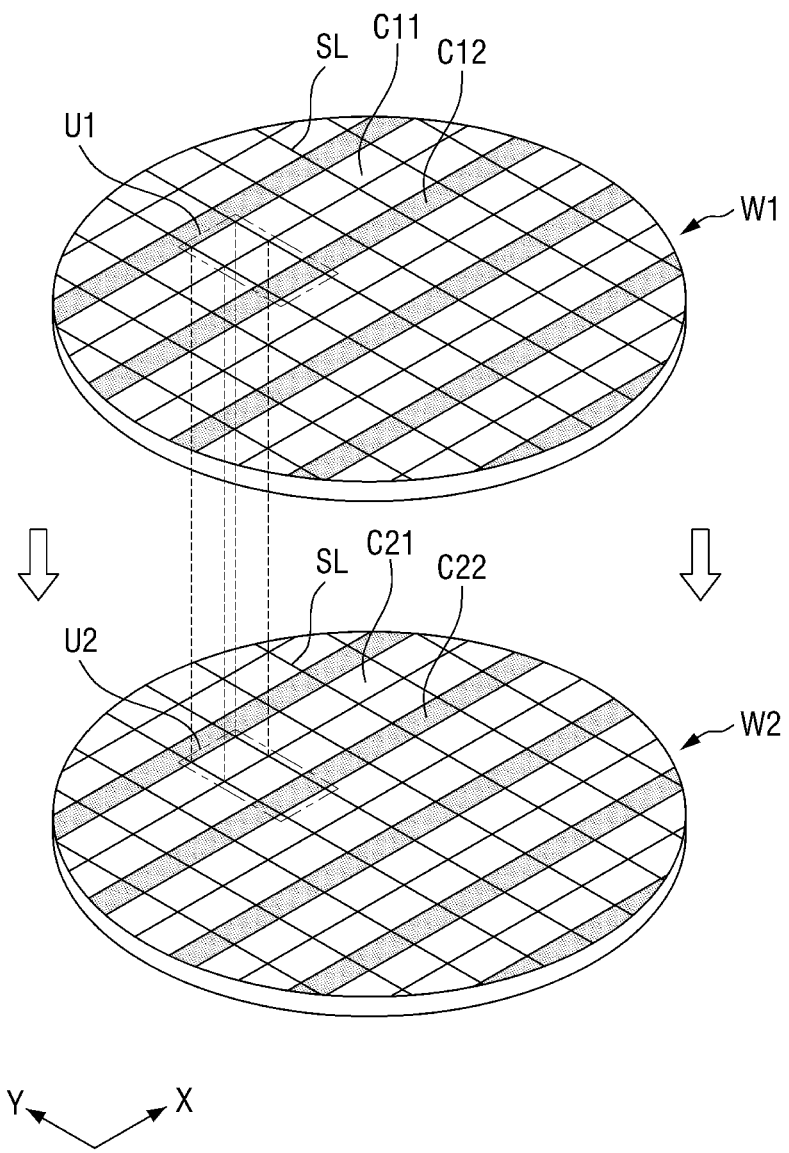
FIG. 8 is an exploded perspective view for explaining the semiconductor wafer according to some embodiments.
Figure 9:
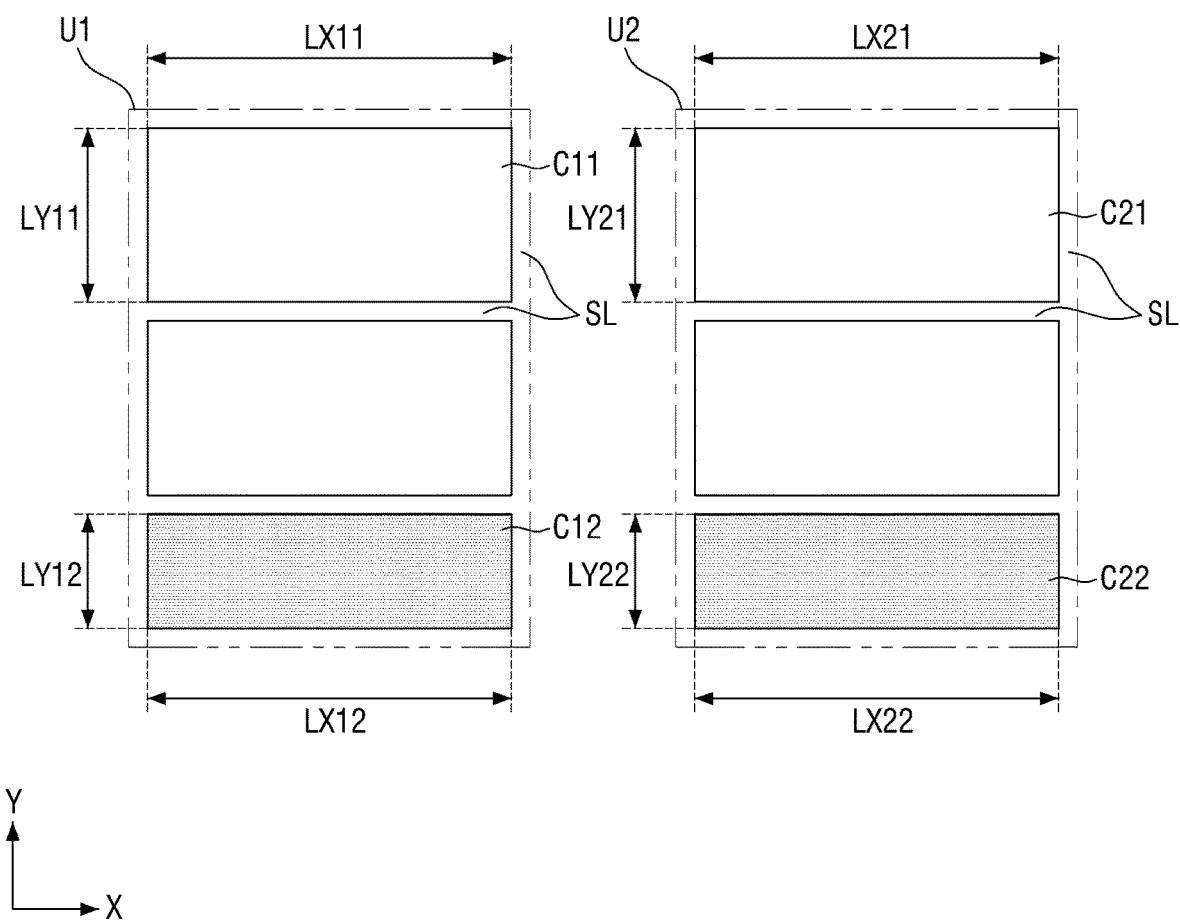
FIG. 9 is an enlarged view for explaining the first unit region and the second unit region of FIG. 8.
Figure 10:
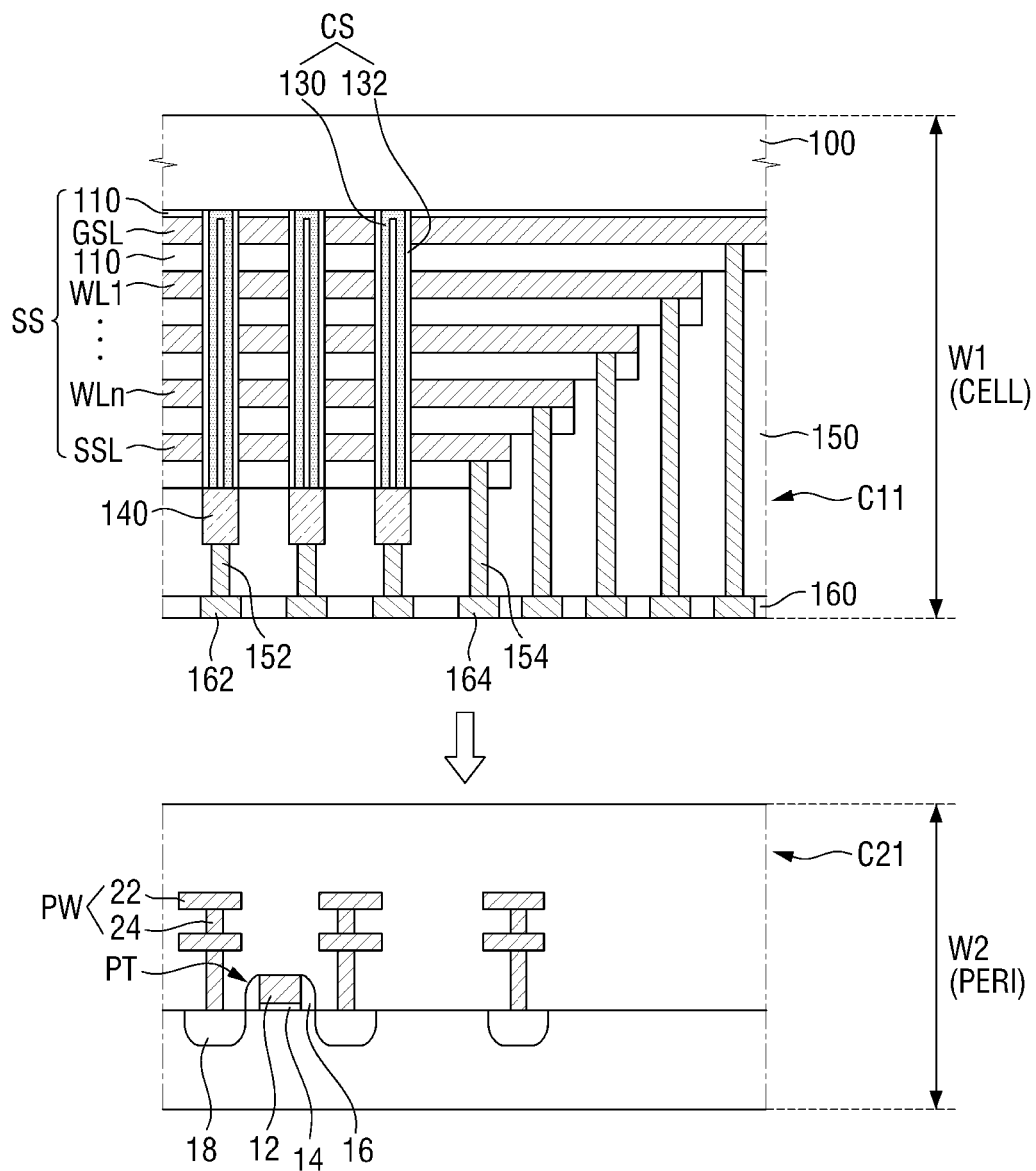
FIG. 10 is an example cross-sectional view for explaining the first chip region and the third chip region of FIG. 8.

FIG. 8 is an exploded perspective view for explaining the semiconductor wafer according to some embodiments. FIG. 9 is an enlarged view for explaining the first unit region and the second unit region of FIG. 8. FIG. 10 is an example cross-sectional view for explaining the first chip region and the third chip region of FIG. 8. For the sake of convenience of explanation, repeated parts of contents explained above using FIGS. 1 to 5 will be briefly explained or omitted.

Referring to FIGS. 8 to 10, the semiconductor wafer according to some embodiments may include a first wafer W1 and a second wafer W2.

Since the first wafer W1 is similar to the semiconductor wafer explained above using FIGS. 1 and 2, a detailed explanation thereof will not be provided below.

The second wafer W2 may be attached to the first wafer W1. For example, the second wafer W2 may be attached below the first wafer W1. The second wafer W2 may include a plurality of a second unit regions U2 that is repeated. In some embodiments, the second unit region U2 of the second wafer W2 may be formed to correspond to the first unit region U1 of the first wafer W1.

Each second unit region U2 may include a fourth chip region C21 and a fifth chip region C22. The fourth chip region C21 and the fifth chip region C22 may be spaced apart from each other by the scribe line SL.

The fourth chip region C21 may have a seventh length LX21 in the first direction X, and may have an eighth length LY21 in the second direction Y. The fifth chip region C22 may have a ninth length LX22 in the first direction X, and may have a tenth length LY22 in the second direction Y.

In some embodiments, a fourth area size of the fourth chip region C22 may be different from a fifth area size of the fifth chip region C22 from a planar viewpoint. For example, as shown, the fourth area size of the fourth chip region C21 may be greater than the fifth area size of the fifth chip region C22.

In some embodiments, the chip region (the first chip region C11 or the second chip region C12) of the first wafer W1 may be formed to correspond to the chip region (the fourth chip region C21 or the fifth chip region C22) of the second wafer W2.

For example, as shown in FIG. 9, the seventh length LX21 of the fourth chip region C21 may be equal to the first length LX11 of the first chip region C11, and the eighth length LY21 of the fourth chip region C21 may be equal to the second length LY11 of the first chip region C11. Also, for example, a ninth length LX22 of the fifth chip region C22 may be equal to the third length LX12 of the second chip region C12, and a tenth length LY22 of the fifth chip region C22 may be equal to the fourth length LY12 of the second chip region C12.

In some embodiments, the chip region (the first chip region C11 or the second chip region C12) of the first wafer W1 may be attached to the chip region (the fourth chip region C21 or the fifth chip region C22) of the second wafer W2 to form a single semiconductor chip.

For example, as shown in FIG. 10, the first chip region C11 of the first wafer W1 may form a cell region CELL of the memory semiconductor chip, and the fourth chip region C21 of the second wafer W2 may form a peripheral circuit region PERI of the memory semiconductor chip. Since the first chip region C11 may be attached to correspond to the fourth chip region C21, the first chip region C11 and the fourth chip region C21 may correspond to each other one-to-one to form a single memory semiconductor chip. For example, the first chip region C11 including a cell region CELL for 512 GB may be attached to the fourth chip region C21 including a peripheral circuit region PERI for 512 GB to form a 512 GB memory semiconductor chip.

Similarly, the second chip region C12 and the fifth chip region C22 correspond to each other one-to-one to form another memory semiconductor chip. For example, the second chip region C12 including a cell region CELL for 256 GB may be attached to the fifth chip region C22 including a peripheral circuit region PERI for 256 GB to form a 256 GB memory semiconductor chip.

Although FIGS. 8 and 10 show that only one first wafer W1 is attached onto the second wafer W2, this is merely an example, and a plurality of the first wafer W1 may, of course, be attached onto the second wafer W2. For example, a plurality of the first chip region C11 corresponding to the fourth chip region C21 and forming the cell region CELL of the memory semiconductor chip may be sequentially attached onto the fourth chip region C21.

Figure 11:
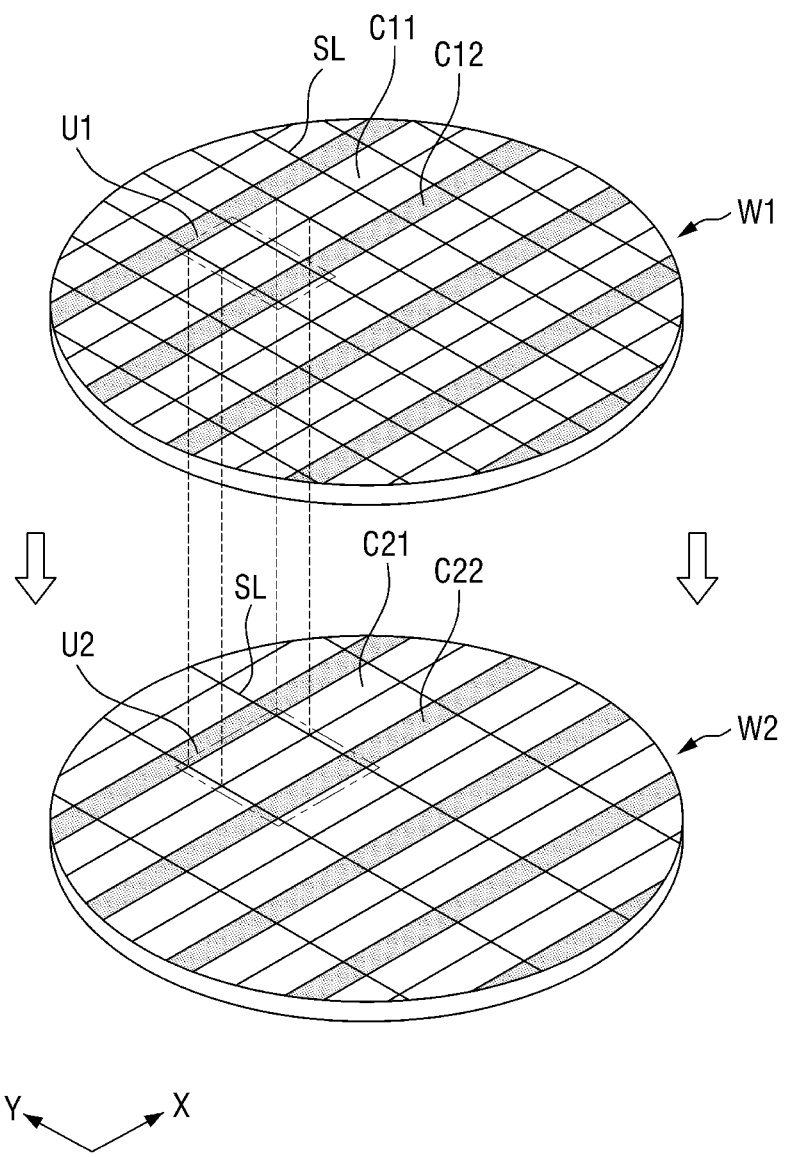
FIG. 11 is an exploded perspective view for explaining a semiconductor wafer according to some embodiments.
Figure 12:
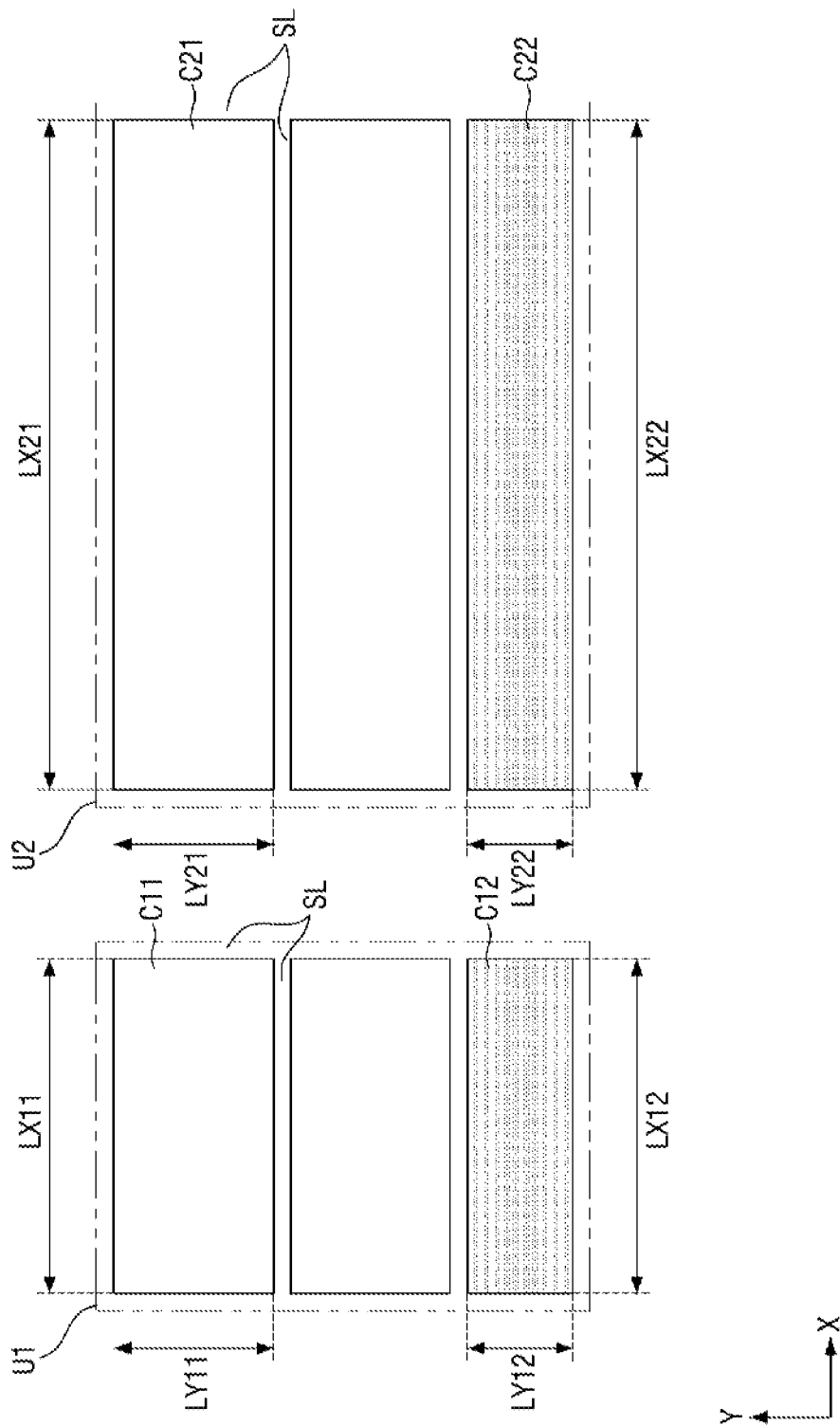
FIG. 12 is an enlarged view for explaining the first unit region and the second unit region of FIG. 11.
Figure 13:
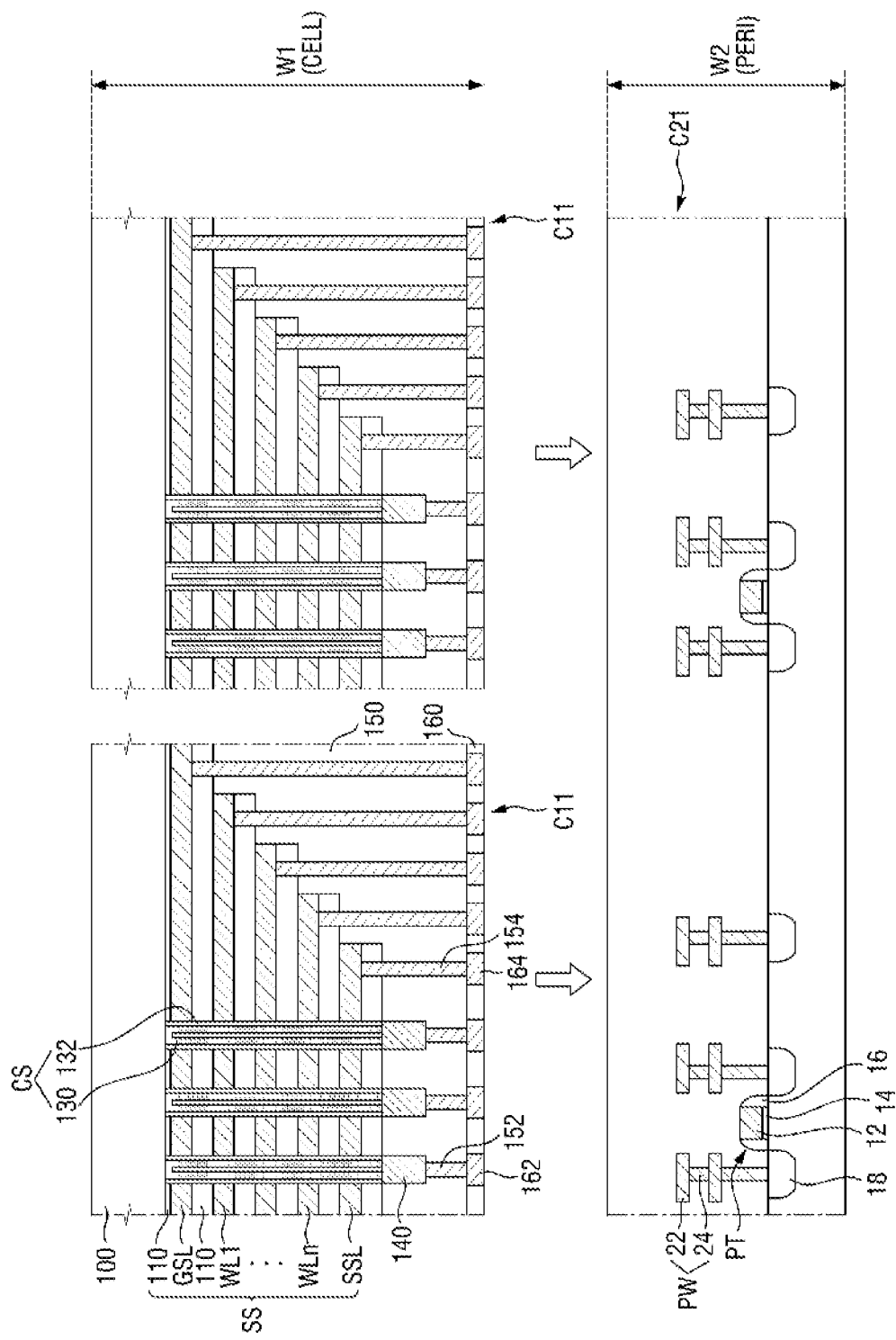
FIG. 13 is an example cross-sectional view for explaining the first chip region and the third chip region of FIG. 11.

FIG. 11 is an exploded perspective view for explaining a semiconductor wafer according to some embodiments. FIG. 12 is an enlarged view for explaining the first unit region and the second unit region of FIG. 11. FIG. 13 is an example cross-sectional view for explaining the first chip region and the third chip region of FIG. 11. For the sake of convenience of explanation, repeated parts of contents explained above using FIGS. 1 to 10 will be briefly explained or omitted.

Referring to FIGS. 11 to 13, in the semiconductor wafer according to some embodiments, the chip region of the second wafer W2 may be formed to correspond to a plurality of chip regions of the first wafer W1.

For example, the fourth chip region C21 may be formed to correspond to n (where n is a natural number equal to or greater than 2) of the first chip region C11.

Each of the first chip region C11 adjacent to each other may be spaced apart from by the scribe lines SL. Thus, for example, when n is 2, the seventh length LX21 may be equal to the sum of twice the width of the scribe line SL and the first length LX11.

That is, as shown in FIG. 12, the seventh length LX21 of the fourth chip region C21 may be greater than n times the first length LX11 of the first chip region C11, and the eighth length LY21 of the fourth chip region C21 may be the equal to the second length LY11 of the first chip region C11. Further, the ninth length LX22 of the fifth chip region C22 may be greater than n times the third length LX12 of the second chip region C12, and the tenth length LY22 of the chip region C22 may be equal to the fourth length LY12 of the second chip region C12.

In some embodiments, the chip region (the first chip region C11 or the second chip region C12) of each of the n first wafer W1 may be attached to the chip region (the four chip region C21 or the fifth chip region C22) of the second wafer W2 to form a single semiconductor chip.

For example, as shown in FIG. 13, n (e.g., two) of the first chip region C11 may form the cell region CELL of the memory semiconductor chip, and one fourth chip region C21 may form the peripheral circuit region PERI of the memory semiconductor chip. Since the first chip region C11 may be attached to correspond to the fourth chip region C21, the first chip region C11 and the fourth chip region C21 may correspond to each other n-to-one to form a single memory semiconductor chip. For example, two of the first chip region C11 including a cell region CELL for 512 GB may be attached to the fourth chip region C21 including a peripheral circuit region PERI for 1 TB to form a 1 TB memory semiconductor chip.

Similarly, the second chip region C12 and the fifth chip region C22 may correspond to each other n-to-one to form another memory semiconductor chip. For example, two of the second chip region C12 including a cell region CELL for 256 GB may be attached to the fifth chip region C22 including a peripheral circuit region PERI for 512 GB to form a 512 GB memory semiconductor chip.

Figure 14:
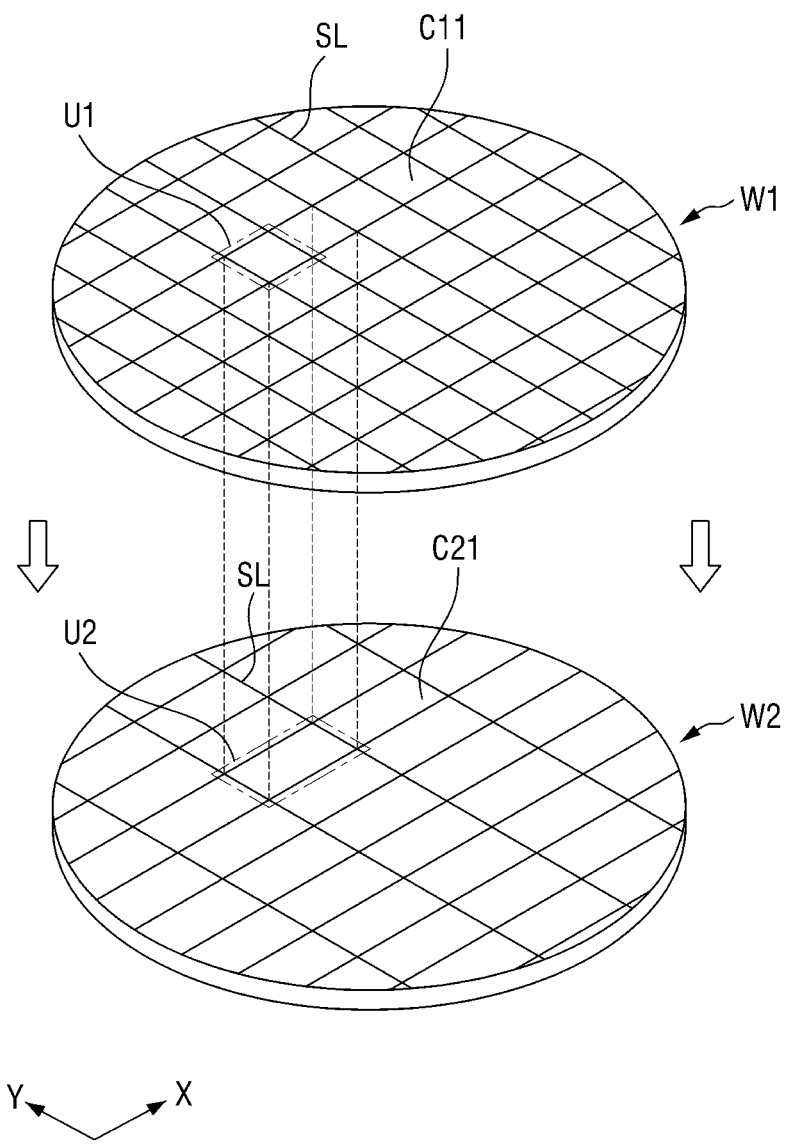
FIG. 14 is an exploded perspective view for explaining the semiconductor wafer according to some embodiments.
Figure 15:
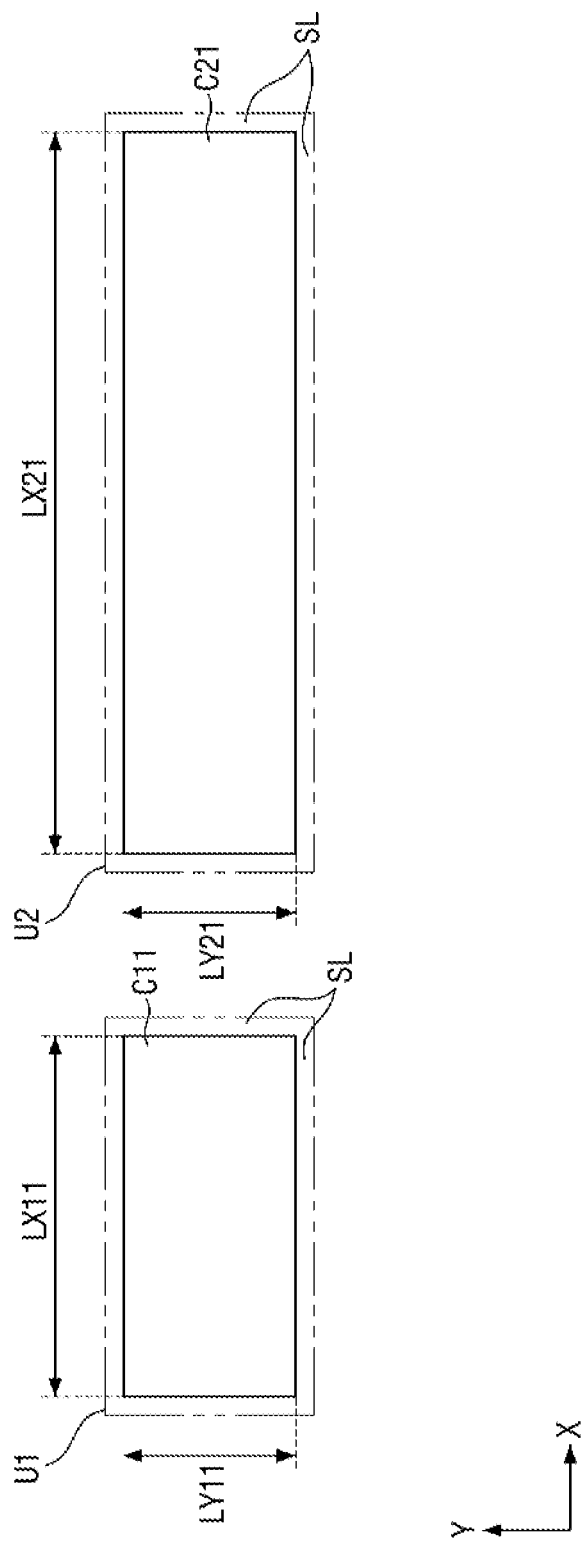
FIG. 15 is an enlarged view for explaining the first unit region and the second unit region of FIG. 14.

FIG. 14 is an exploded perspective view for explaining the semiconductor wafer according to some embodiments. FIG. 15 is an enlarged view for explaining the first unit region and the second unit region of FIG. 14. For the sake of convenience, repeated parts of contents explained above using FIGS. 1 to 13 will be briefly explained or omitted.

Referring to FIGS. 14 and 15, in the semiconductor wafer according to some embodiments, the first wafer W1 includes only a plurality of the first chip region C11 of a single area size, and the second wafer W2 may include only a plurality of the fourth chip region C21 of a single area size.

For example, the first unit region U1 of the first wafer W1 may not include chip regions of different area sizes from each other. Also, the second unit region U2 of the second wafer W2 may not include chip regions of different area sizes from each other.

In some embodiments, the chip region of the second wafer W2 may be formed to correspond to the plurality of chip regions of the first wafer W1. For example, the fourth chip region C21 may be formed to correspond to m (where, m is a natural number) of the first chip region C11.

Each of the first chip region C11 adjacent to each other may be spaced apart from each other by the scribe lines SL. Thus, for example, when m is 2, the seventh length LX21 may be equal to the sum of twice the width of the scribe line SL and the first length LX11.

That is, as shown in FIG. 15, the seventh length LX21 of the fourth chip region C21 may be greater than m times the first length LX11 of the first chip region C11, and the eighth length LY21 of the fourth chip region C21 may be equal to the second length LY11 of the first chip region C11.

In some embodiments, each of the m first chip region C11 may be attached to the fourth chip region C21 to form a single semiconductor chip.

Hereinafter, a method for fabricating a semiconductor wafer according to some embodiments will be explained with reference to FIGS. 1 to 21H.

Figure 16:
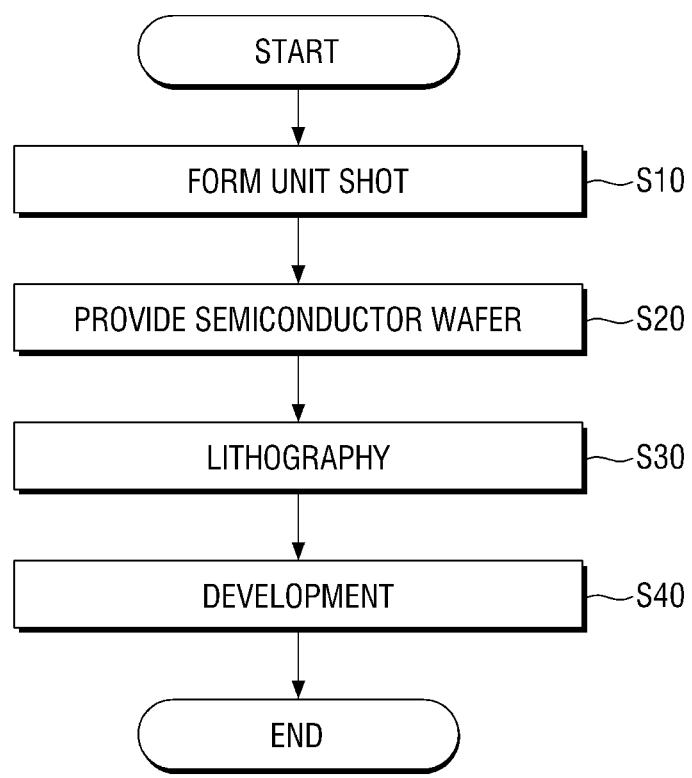
FIG. 16 is a flowchart for explaining the method for fabricating the semiconductor wafer according to some embodiments.
Figure 17:
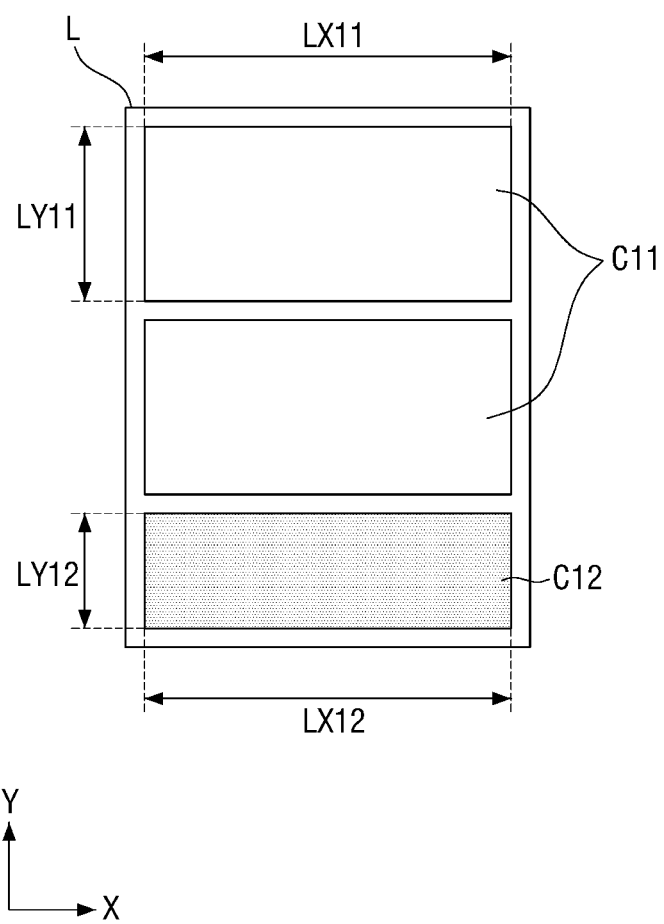
FIG. 17 is a plan view for explaining a unit shot formed according to some embodiments.
Figure 18:
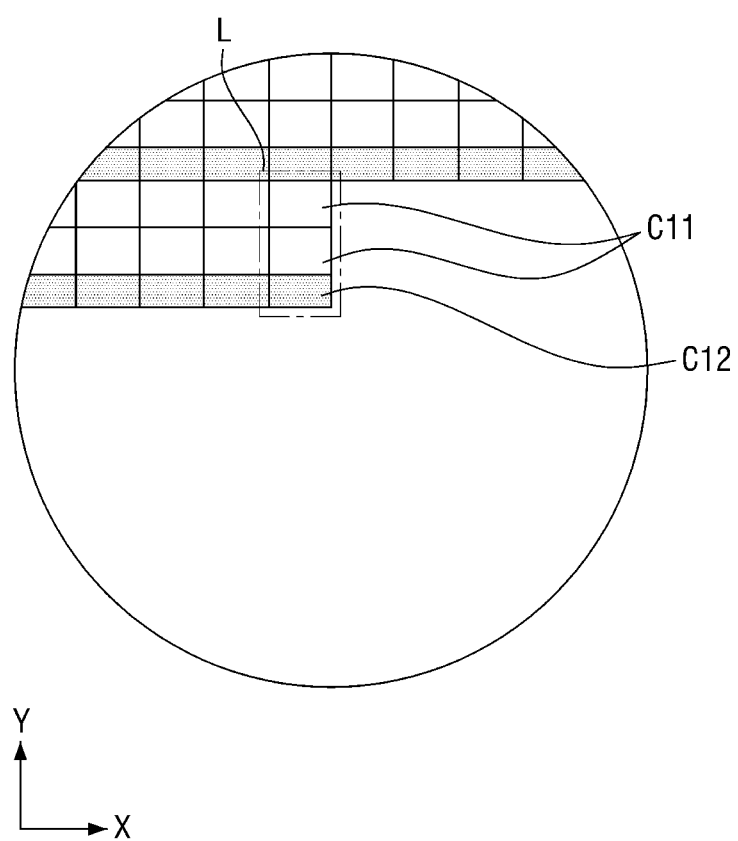
FIG. 18 is a plan view for explaining a semiconductor wafer fabricated using the unit shot according to some embodiments.

FIG. 16 is a flowchart for explaining the method for fabricating the semiconductor wafer according to some embodiments. FIG. 17 is a plan view for explaining a unit shot formed according to some embodiments. FIG. 18 is a plan view for explaining a semiconductor wafer fabricated using the unit shot according to some embodiments. For convenience of explanation, repeated parts of contents explained above using FIGS. 1 to 15 will be briefly explained or omitted.

Referring to FIGS. 16 and 17, a unit shot L including the first chip region C11 and the second chip region C12 is formed (S10).

In some embodiments, the first area size of the first chip region C11 may be different from the second area size of the second chip region C12 from a planar viewpoint. For example, as shown in FIGS. 1 and 2, the first area size of the first chip region C11 may be greater than the second area size of the second chip region C12.

For example, the first length LX11 of the first chip region C11 may be equal to the third length LX12 of the second chip region C12, and the second length LY11 of the first chip region C11 may be greater than the fourth length LY12 of the second chip region C12. That is, each first unit region U1 may include the first chip region C11 and the second chip region C12 having different area sizes from each other.

Referring to FIGS. 16 and 18, a semiconductor wafer is provided (S20). For example, a semiconductor wafer may be loaded onto a lithography device. The semiconductor wafer may be, but is not limited to, a bare wafer in which no pre-process is performed. A photoresist or the like may be coated on the semiconductor wafer, and another material film (e.g., an insulating film or a conductive film) may, of course, be interposed between the semiconductor wafer and the photoresist.

Subsequently, the lithography is performed on the semiconductor wafer using the unit shot L (S30). Therefore, the pattern of the unit shot L may be transferred to the photoresist of the semiconductor wafer. The lithography process using the unit shot L may be repeated to perform the lithography process on the entire semiconductor wafer.

Subsequently, the photoresist onto which the pattern of the unit shot L is transferred is developed (S40). For example, a remaining patterning process such as an etching process using a photoresist onto which the pattern of the unit shot L is transferred may be performed. Therefore, the first chip region C11 and the second chip region C12 may be transferred onto the semiconductor wafer.

Figure 20:
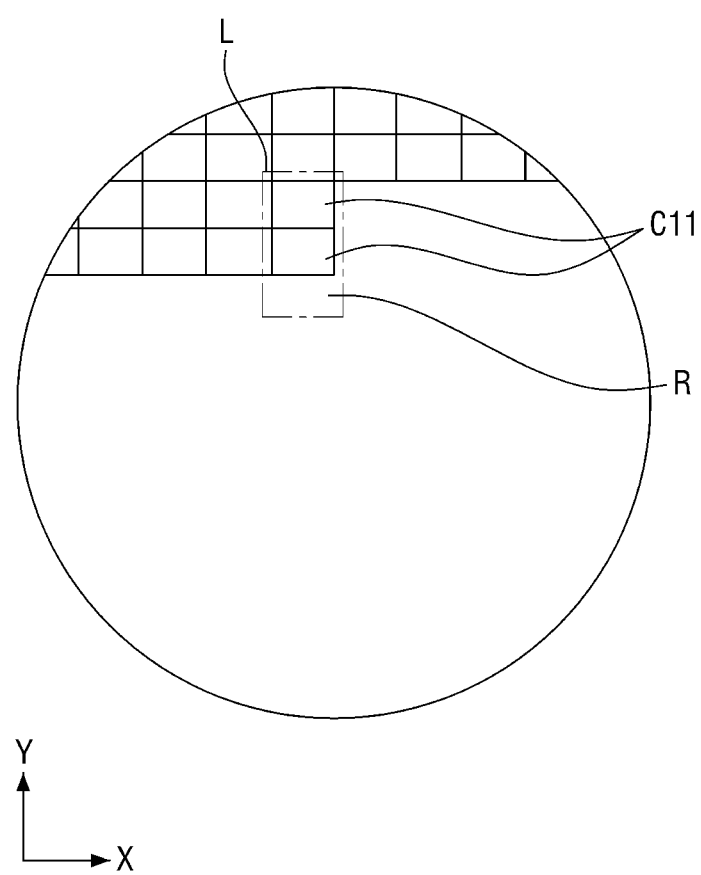
FIG. 20 is a second diagram for explaining the effects of the method for fabricating the semiconductor wafer according to some embodiments.

FIGS. 19 and 20 are diagrams for explaining the effects of the method for fabricating the semiconductor wafer according to some embodiments. For the sake of convenience of explanation, repeated parts of contents explained above using FIGS. 1 to 18 will be briefly explained or omitted.

As compared with the unit shot L of FIG. 17, the unit shot L of FIG. 19 includes only a chip region of a single area size. For example, the unit shot L of FIG. 19 includes only the first chip region C11 of the first area size.

Since the size of the unit shot L is fixed by the lithography device, when only the chip regions of the single area size are placed in the unit shot L, an extra space may occur. For example, as shown in FIG. 19, when only a plurality of the first chip region C11 is placed in the unit shot L, an extra space such as a space R may occur.

The unit shot L including an excessive surplus space increases the number of shots required to execute the lithography process on the entire semiconductor wafer, which causes a reduction in product productivity. For example, the unit shot L of FIG. 19 increases the number of shots required to execute the lithography process on the entire semiconductor wafer of FIG. 20.

However, as shown in FIG. 17, in the method for fabricating the semiconductor wafer according to some embodiments, chip regions of different area sizes may be placed in the unit shot L. That is, since the first chip region C11 and the second chip region C12 having different area sizes from each other are placed in the unit shot L of FIG. 17, it is possible to minimize an extra space such as the space R of FIG. 19.

For example, when comparing FIG. 18 with FIG. 20, the number of shots required to execute the lithography process on the entire semiconductor wafer using the unit shot L of FIG. 17 is smaller than the number of shots required to execute the lithography process on the entire semiconductor wafer using the unit shot L of FIG. 19. That is, in the method for fabricating the semiconductor wafer according to some embodiments, by increasing the occupied area of the chip region in the unit shot L, it is possible to reduce the number of shots required to execute the lithography process on the entire semiconductor wafer. Therefore, it is possible to provide the method for fabricating the semiconductor wafer having improved product productivity.

FIGS. 21A to 21H are example diagrams for explaining the unit shot according to some embodiments. For the sake of convenience, repeated parts of contents explained above using FIGS. 1 to 20 will be briefly explained or omitted.

Referring to FIGS. 21A to 21E, in the method for fabricating the semiconductor wafer according to some embodiments, the unit shot L may include a plurality of the first chip region C11 and a plurality of the second chip region C12.

In some embodiments, the plurality of the first chip region C11 and the plurality of the second chip region C12 may be placed in a bilateral symmetry. For example, the unit shot L may include a first symmetry line LS1 extending in the second direction Y while passing through the center of the unit shot L from a planar viewpoint. At this time, the plurality of the first chip region C11 and the plurality of the second chip region C12 may be symmetrically arranged on the basis of the first symmetry line LS1.

Figure 21A:
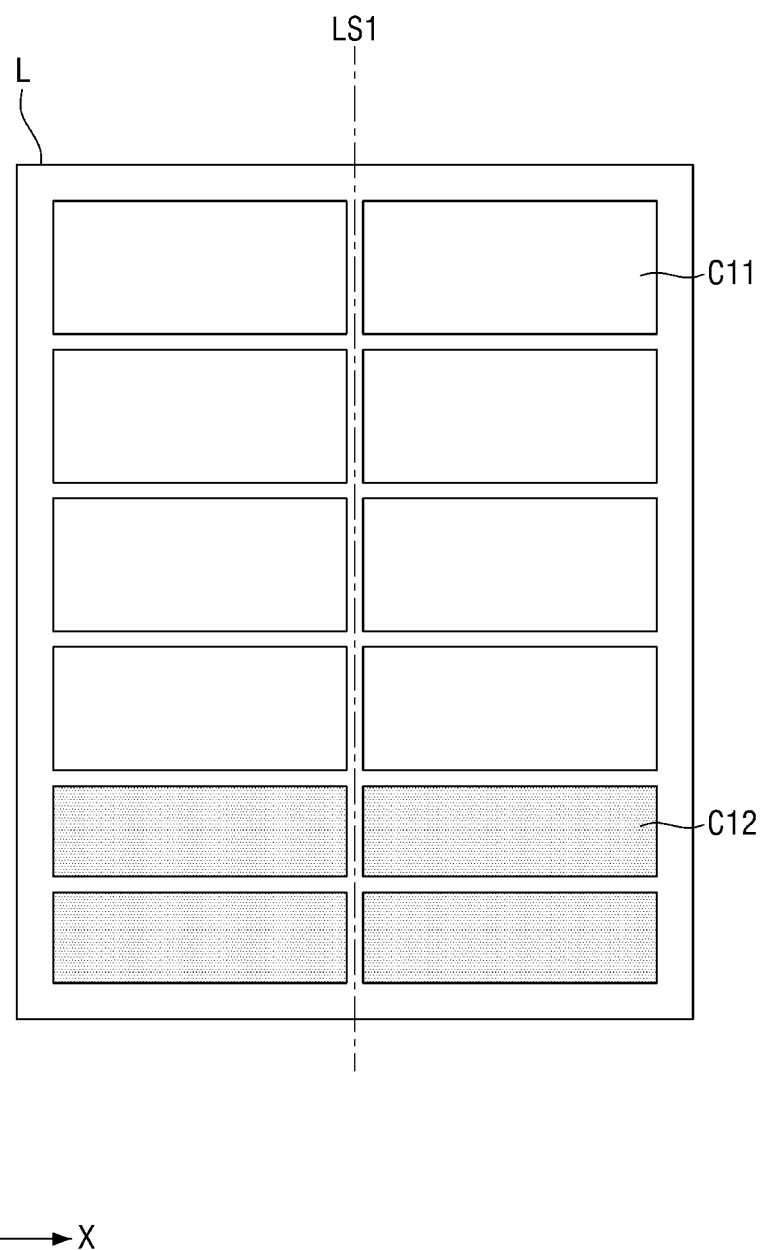
FIG. 21A is an example diagram for explaining a unit shot according to an embodiment.
Figure 21B:
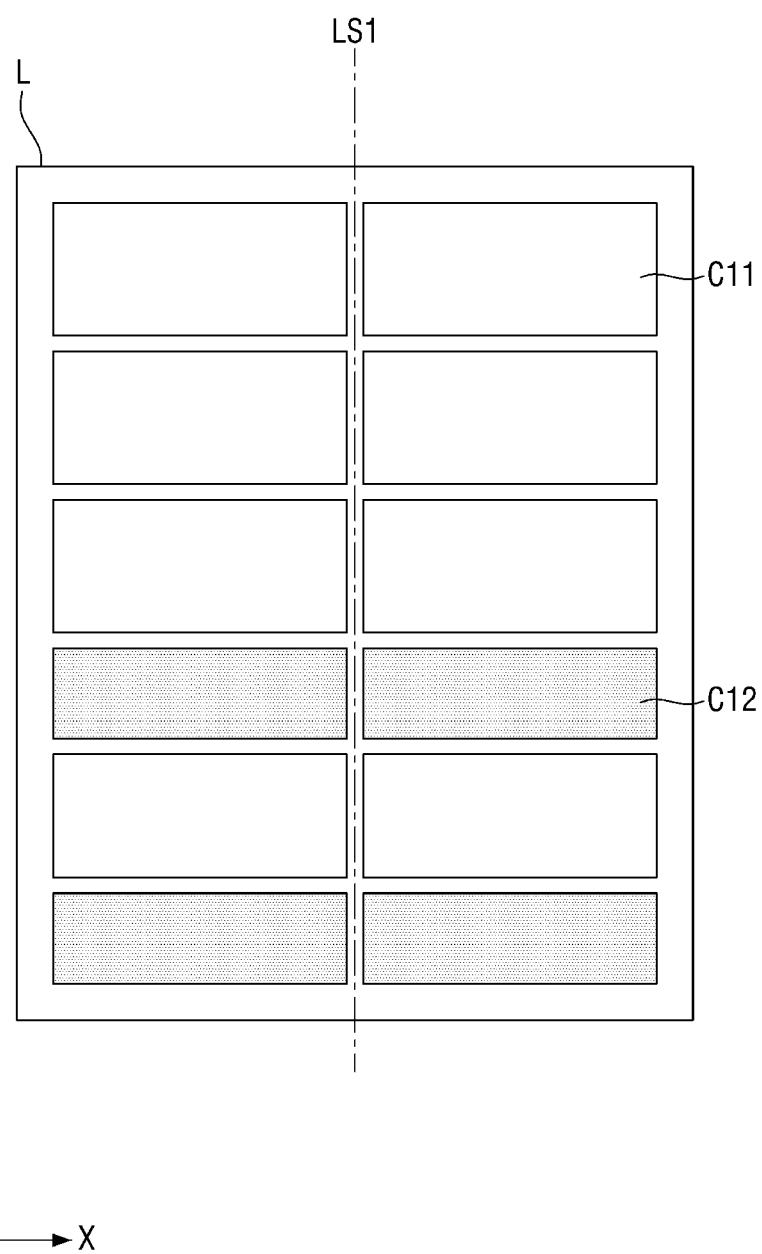
FIG. 21B is an example diagram for explaining a unit shot according to an embodiment.
Figure 21C:
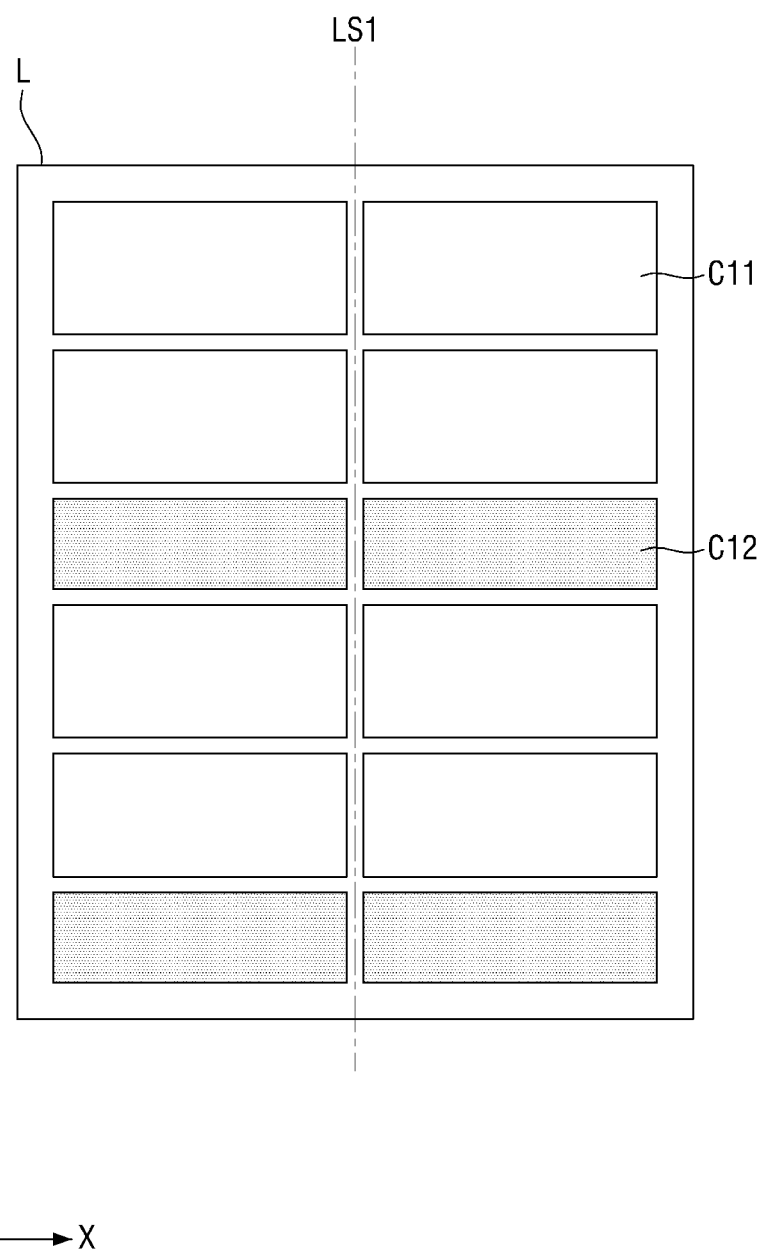
FIG. 21C is an example diagram for explaining a unit shot according to an embodiment.
Figure 21D:
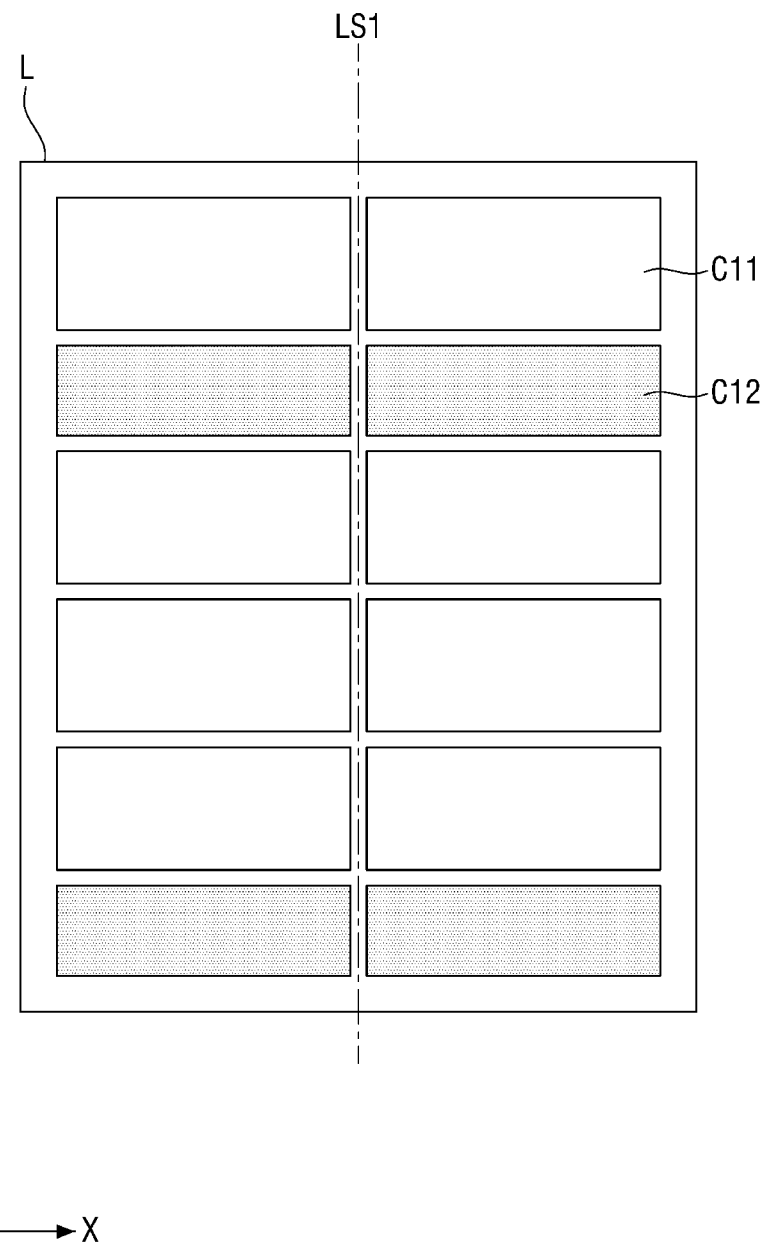
FIG. 21D is an example diagram for explaining a unit shot according to an embodiment.
Figure 21E:
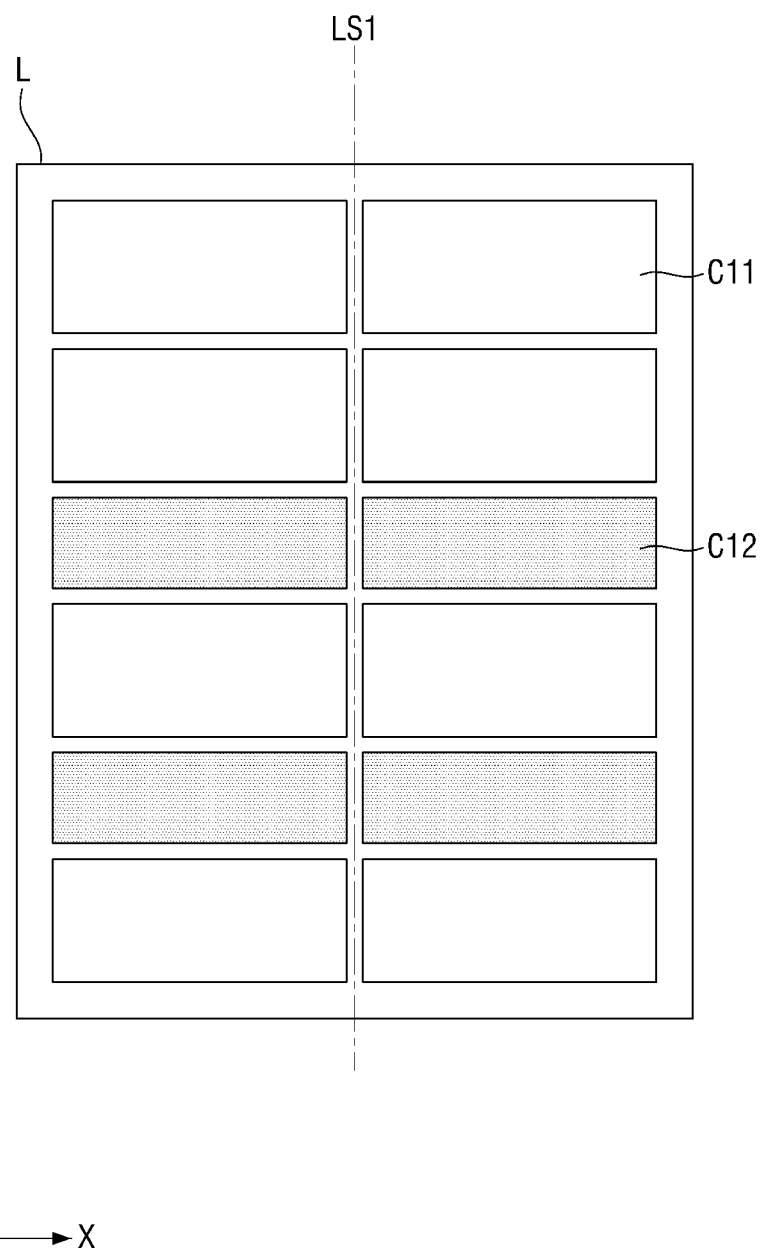
FIG. 21E is an example diagram for explaining a unit shot according to an embodiment.
Figure 21F:
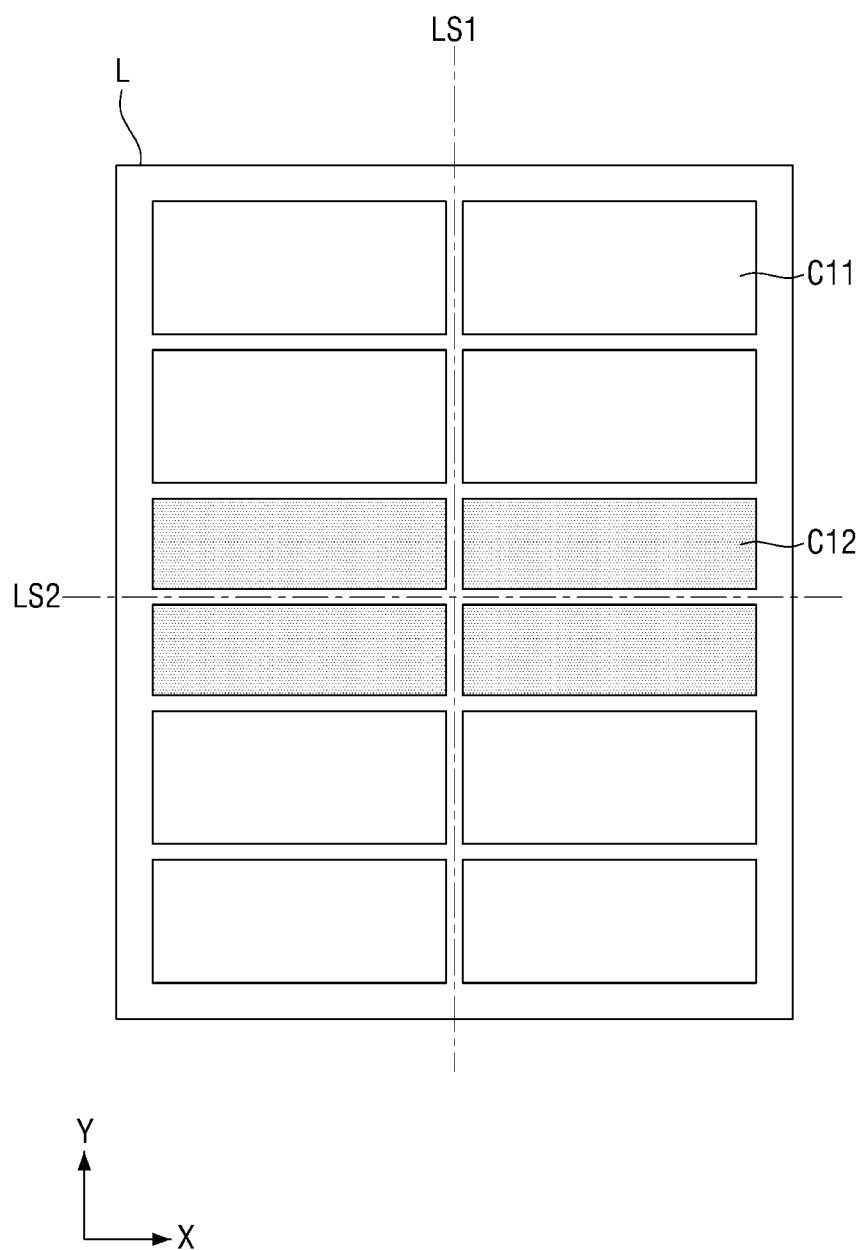
FIG. 21F is an example diagram for explaining a unit shot according to an embodiment.
Figure 21G:
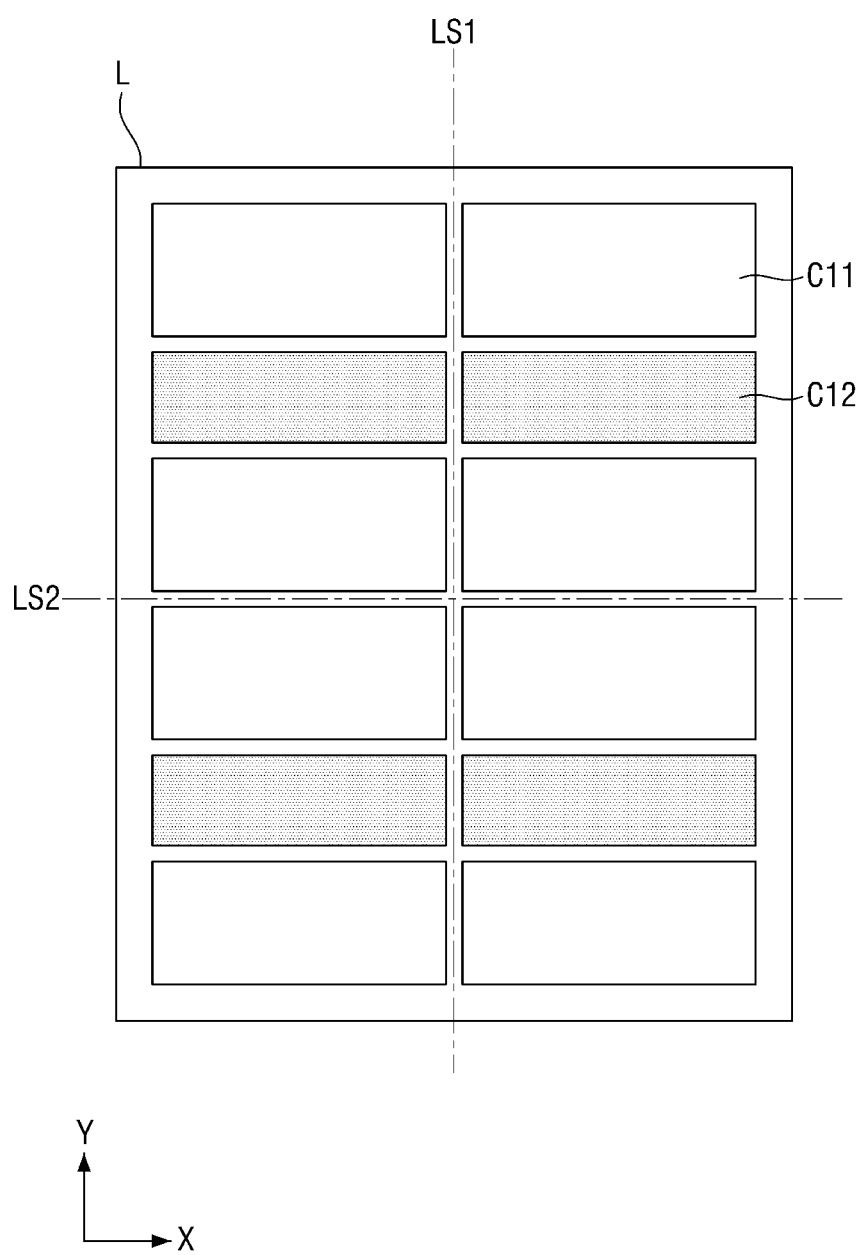
FIG. 21G is an example diagram for explaining a unit shot according to an embodiment.
Figure 21H:
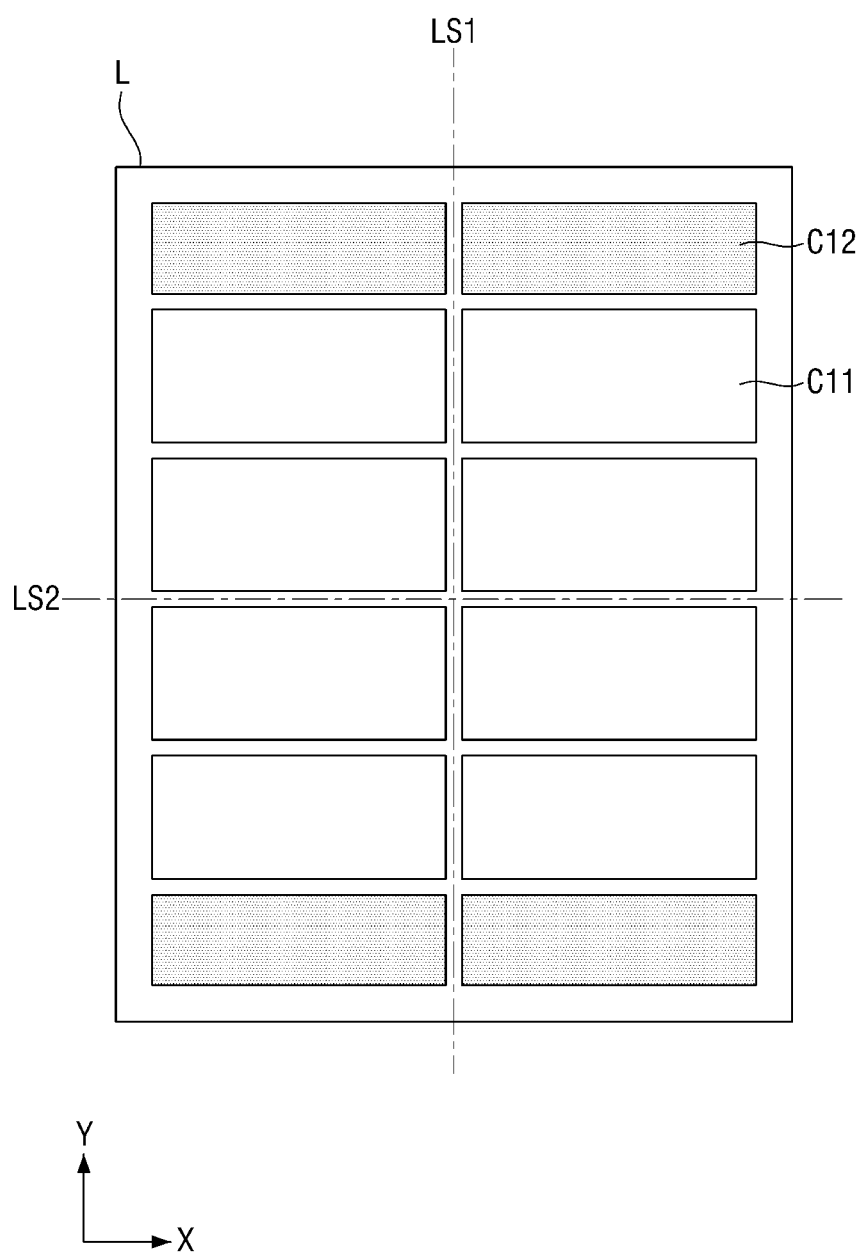
FIG. 21H is an example diagram for explaining a unit shot according to an embodiment.

Referring to FIGS. 21F to 21H, in the method for fabricating the semiconductor wafer according to some embodiments, the plurality of the first chip region C11 and the plurality of the second chip region C12 may be arranged in a bilateral symmetry and a vertical symmetry.

For example, the unit shot L may further include a second symmetry line LS2 extending in the first direction X while passing through the center of the unit shot L from a planar viewpoint. At this time, the plurality of the first chip region C11 and the plurality of the second chip region C12 may not only be arranged symmetrically on the basis of the first symmetry line LS1, but also be arranged symmetrically on the basis of the second symmetry line LS2.

Hereinafter, a memory device according to some embodiments will be explained with reference to FIGS. 1 to 22.

Figure 22:
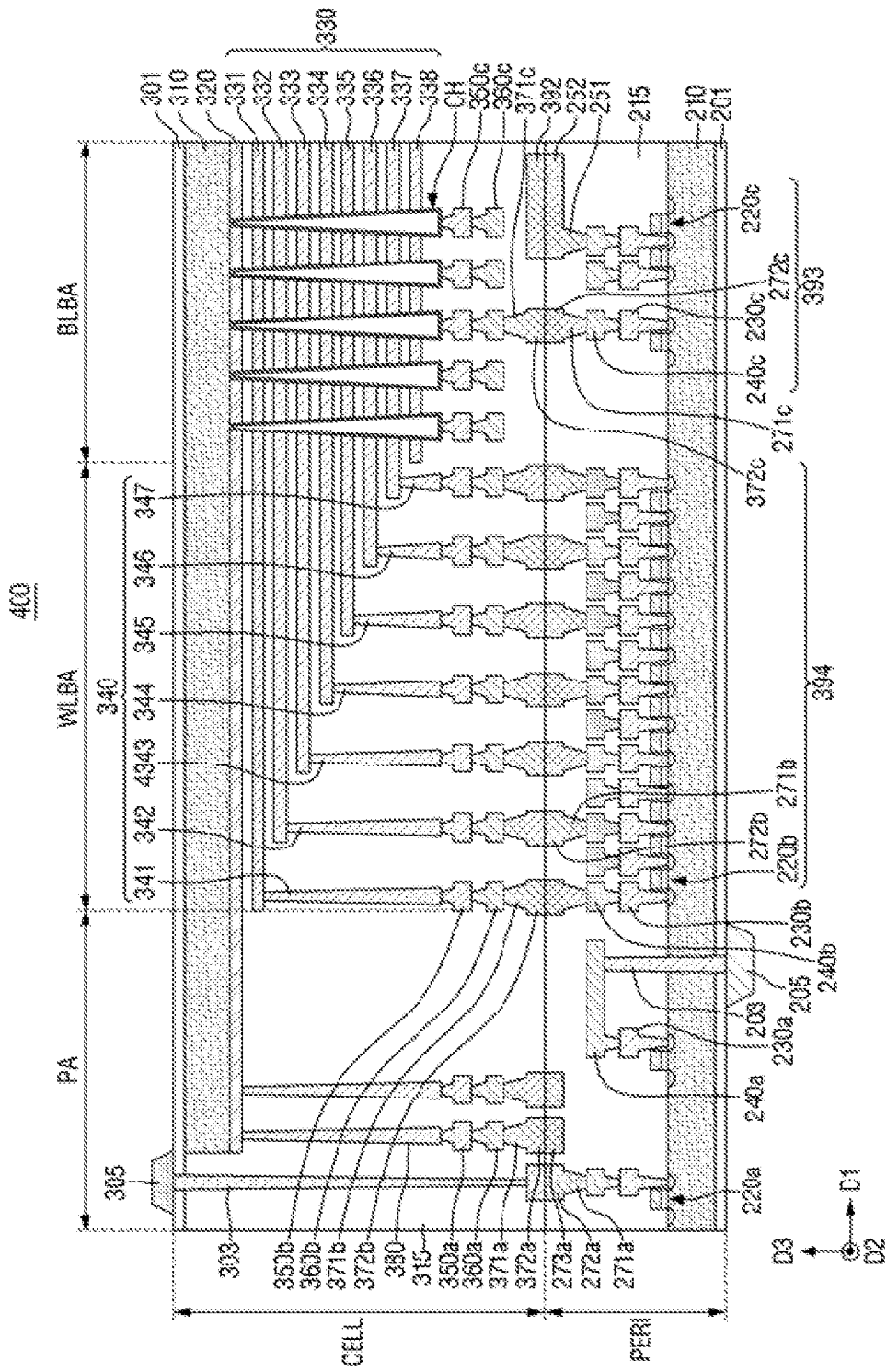
FIG. 22 is an example diagram for explaining a memory device according to an embodiment.

FIG. 22 is an example diagram for explaining a memory device according to an embodiment.

Referring to FIG. 22, a memory device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 400 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high electrical resistivity, and the second metal layers 240a, 240b, and 240c may be formed of copper having relatively low electrical resistivity.

In an example embodiment illustrate in FIG. 22, although only the first metal layers 230a, 230b, and 230c and the second metal layers 240a, 240b, and 240c are shown and described, the example embodiment is not limited thereto, and one or more additional metal layers may be further formed on the second metal layers 240a, 240b, and 240c. At least a portion of the one or more additional metal layers formed on the second metal layers 240a, 240b, and 240c may be formed of aluminum or the like having a lower electrical resistivity than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 5271b and 5272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a D3-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction (a D3-axis direction), perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a fourth direction (a D2-axis direction), parallel to the upper surface of the second substrate 310.

In an example embodiment illustrated in FIG. 22, an area in which the channel structure CH, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a fifth direction (an D1-axis direction), parallel to the upper surface of the second substrate 310 and perpendicular to the fourth direction (a D2-axis direction), and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the fifth direction (an D1-axis direction). A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b forming a row decoder 394 in the peripheral circuit region PERI. In an example embodiment, operating voltages of the circuit elements 220b of the row decoder 394 may be different than operating voltages of the circuit elements 220c forming the page buffer 393. For example, operating voltages of the circuit elements 220c forming the page buffer 393 may be greater than operating voltages of the circuit elements 220b forming the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 22, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 22, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303. In the example embodiment, the second input-output pad 305 is electrically connected to a circuit element 220a.

According to embodiments, the second substrate 310 and the common source line 320 may not be disposed in an area in which the second input-output contact plug 303 is disposed. Also, the second input-output pad 305 may not overlap the word lines 330 in the sixth direction (the D3-axis direction). Referring to FIG. 22, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 205 and the second input-output pad 305 may be selectively formed. For example, the memory device 400 may include only the first input-output pad 205 disposed on the first substrate 210 or the second input-output pad 305 disposed on the second substrate 310. Alternatively, the memory device 400 may include both the first input-output pad 205 and the second input-output pad 305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 400 may include a lower metal pattern 273a, corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern 372a, corresponding to the lower metal pattern 273a formed in an uppermost metal layer of the peripheral circuit region PERI, and having the same shape as a lower metal pattern 273a of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu-to-Cu bonding.

Further, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

Those skilled in the art will appreciate that many variations and modifications may be made to embodiments of the present disclosure without substantially departing from principles of the present disclosure. Therefore, the described embodiments of the present disclosure are described in a general and descriptive sense only and not for purposes of limitation.

What is claimed is:

1. A semiconductor wafer comprising:
   unit regions that are repeatedly arranged along a first direction and spaced apart from each other by at least one first scribe line that is a straight line that extends in a second direction intersecting the first direction, and each unit region of the unit regions comprises:
   at least one first chip region; and
   at least one second chip region spaced apart from the at least one first chip region in the second direction by a second scribe line that is a straight line that extends in the first direction,
   wherein a first area size of each of the at least one first chip region is different from a second area size of each of the at least one second chip region from a planar viewpoint, and
   wherein the unit regions are repeatedly arranged in the first direction such that the second scribe line is directly between, in the second direction, the at least one first chip region and the at least one second chip region of each of the unit regions that are repeatedly arranged in the first direction, and
   wherein the unit regions are repeatedly arranged in the first direction such that a plurality of the at least one first chip region of the unit regions are arranged in the first direction, and such that a plurality of the at least one second chip region of the unit regions are arranged in the first direction.

2. The semiconductor wafer of claim 1, wherein the at least one first chip region has a first length in the first direction, and has a second length in the second direction intersecting the first direction, and the at least one second chip region has a third length in the first direction that is equal to the first length, and has a fourth length in the second direction that is different from the second length.

3. The semiconductor wafer of claim 2, wherein the at least one first chip region and the at least one second chip region are arranged along the second direction within each of the unit regions.

4. The semiconductor wafer of claim 1, wherein the at least one first chip region of each unit region is a plurality of first chip regions.

5. The semiconductor wafer of claim 1, wherein each of the at least one first chip region and the at least one second chip region comprises:
   a cell region comprising a memory cell array; and
   a peripheral circuit region which is configured to control the memory cell array.

6. The semiconductor wafer of claim 5, wherein the peripheral circuit region is formed around the cell region from the planar viewpoint.

7. The semiconductor wafer of claim 5, wherein the cell region is stacked on the peripheral circuit region.

8. The semiconductor wafer of claim 5, wherein the peripheral circuit region comprises:
   a row decoder configured to select a word line of the memory cell array;
   a page buffer configured to read information stored in the memory cell array; and
   a column decoder connected to a bit line of the memory cell array.

9. The semiconductor wafer of claim 1, wherein each of the at least one first chip region and the at least one second chip region comprises:
   a substrate;
   a stacked structure comprising word lines sequentially stacked on the substrate;
   a channel structure penetrating the stacked structure and intersecting each of the word lines; and
   a bit line connected to the channel structure.

10. A semiconductor wafer comprising:
    first chip regions arranged along a first direction;
    second chip regions arranged along the first direction; and
    a scribe lines, wherein each of the first chip regions has a first length in the first direction, and has a second length in a second direction intersecting the first direction, each of the second chip regions has a third length in the first direction that is equal to the first length, and has a fourth length in the second direction that is different from the second length, and the scribe lines comprise:

at least one first scribe line that is a straight line that extends in the second direction and which separates the first chip regions from each other and separates the second chip regions from each other; and a second scribe line that is a straight line that extends in the first direction and which separates the second chip regions from the first chip regions.

11. The semiconductor wafer of claim 10, further comprising:

third chip regions arranged along the first direction, wherein each of the third chip regions has a fifth length in the first direction that is equal to the first length, and has a sixth length in the second direction that is different from the second length and the fourth length.

12. A semiconductor wafer comprising:

a first wafer comprising first unit regions that are repeated; and a second wafer comprising second unit regions that are repeated, the second wafer attached to the first wafer in a vertical direction, wherein the first wafer comprises a plurality of first chip regions spaced apart from each other along a first direction by at least one first scribe line, that is a straight line that extends in a second direction intersecting the first direction, and each of the first unit regions comprises a first chip region from among the plurality of first chip regions, wherein the second wafer comprises a plurality of second chip regions spaced apart from each other along the first direction by at least one second scribe line, that is a straight line that extends in the second direction, and each of the second unit regions comprises a second chip region, from among the plurality of second chip regions, that corresponds to n first chip regions from among the plurality of first chip regions, where n is a natural number greater than 1, and wherein each of the at least one second scribe line is directly overlapping with a respective one of the at least one first scribe line in the vertical direction.

13. The semiconductor wafer of claim 12, wherein the second wafer is attached to the first wafer such that the n first chip regions are provided on the second chip region.

14. The semiconductor wafer of claim 12, wherein each of the plurality of first chip regions has a first length in the first direction, and has a second length in the second direction intersecting the first direction, and each of the plurality of second chip regions has a third length in the first direction that is greater than n times the first length, and has a fourth length in the second direction that is equal to the second length.

15. The semiconductor wafer of claim 12, wherein the first wafer comprises a plurality of third chip regions, each first unit region from among the first unit regions further comprises a third chip region, from among the plurality of third chip regions, spaced apart from the first chip region of the first unit region along the second direction by a third scribe line that is a straight line that extends in the first direction, and an area size of the first chip region is different from an area size of the third chip region from a planar viewpoint.

16. The semiconductor wafer of claim 15, wherein each second unit region of the second unit regions further comprises a fourth chip region spaced apart from the second chip region of the second unit region along the second direction by a fourth scribe line that is a straight line that extends in the first direction, and an area size of the second chip region is different from an area size of the fourth chip region from the planar viewpoint, and the fourth scribe line is directly overlapping with the third scribe line in the vertical direction.

17. The semiconductor wafer of claim 16, wherein the fourth chip region corresponds to n third chip regions from among the plurality of third chip regions.

* * * * *